US012360160B2

(12) United States Patent
Doshi et al.

(10) Patent No.: US 12,360,160 B2
(45) Date of Patent: Jul. 15, 2025

(54) SYSTEMS AND METHODS FOR NETWORKED DEVICE TESTING

(71) Applicant: INTEL CORPORATION, Santa Clara, CA (US)

(72) Inventors: Kshitij Doshi, Tempe, AZ (US); Francesc Guim Bernat, Barcelona (ES)

(73) Assignee: INTEL CORPORATION, Santa Clara, CA (US)

(*) Notice: Subject to any disclaimer, the term of this patent is extended or adjusted under 35 U.S.C. 154(b) by 780 days.

(21) Appl. No.: 17/485,195

(22) Filed: Sep. 24, 2021

(65) Prior Publication Data
US 2022/0082616 A1 Mar. 17, 2022

(51) Int. Cl.
G01R 31/3177 (2006.01)
G06F 11/14 (2006.01)
G06F 11/263 (2006.01)
G06F 16/2458 (2019.01)
G06F 18/2337 (2023.01)
G06F 30/33 (2020.01)
G06F 30/34 (2020.01)
G06F 30/343 (2020.01)

(52) U.S. Cl.
CPC ...... G01R 31/3177 (2013.01); G06F 11/1438 (2013.01); G06F 11/263 (2013.01); G06F 16/2458 (2019.01); G06F 16/2468 (2019.01); G06F 18/2337 (2023.01); G06F 30/343 (2020.01); G06F 30/33 (2020.01); G06F 30/34 (2020.01)

(58) Field of Classification Search
CPC ............ G01R 31/3177; G06F 11/1438; G06F 11/263; G06F 30/343; G06F 30/33; G06F 30/34; G06F 16/2458; G06F 16/2468; G06F 18/2337
See application file for complete search history.

(56) References Cited

U.S. PATENT DOCUMENTS

| 7,024,345 | B1* | 4/2006 | Stamm | G06F 30/33 714/739 |
| 10,983,901 | B1* | 4/2021 | Pearce | G06F 11/3688 |
| 2014/0115396 | A1* | 4/2014 | Fournier | G06F 11/263 714/33 |
| 2018/0232523 | A1* | 8/2018 | Copty | G06N 7/023 |
| 2018/0351986 | A1* | 12/2018 | Johns | G06F 11/3688 |
| 2019/0220387 | A1* | 7/2019 | Phan | G06F 11/3664 |

(Continued)

OTHER PUBLICATIONS

Karamcheti et al., Adaptive Grey-Box Fuzz-Testing with Thompson Sampling, Aug. 24, 2018, ACM, pp. 1-11. (Year: 2018).*

(Continued)

Primary Examiner — John J Tabone, Jr.
(74) Attorney, Agent, or Firm — HANLEY, FLIGHT & ZIMMERMAN, LLC

(57) ABSTRACT

Methods, apparatus, systems, and articles of manufacture for networked device testing are disclosed. An example method includes determining an input to be applied to a programmable network device, mutating the input to determine an input variant, applying the input variant to the programmable network device, and in response to determining that the input variant causes the programmable network device to enter an expected state, add the input variant to a test set.

18 Claims, 20 Drawing Sheets

(56) References Cited

U.S. PATENT DOCUMENTS

| | | | | |
|---|---|---|---|---|
| 2019/0266074 A1* | 8/2019 | Copty | ................ | G06F 11/3676 |
| 2019/0384697 A1* | 12/2019 | Phan | ................ | G06F 11/3676 |
| 2020/0356468 A1* | 11/2020 | Fugate | ................ | G06F 11/3688 |
| 2021/0397543 A1* | 12/2021 | Wu | ................ | G06F 11/3684 |
| 2022/0082616 A1* | 3/2022 | Doshi | ................ | G06F 11/1438 |

OTHER PUBLICATIONS

Karamcheti et al., Improving Grey-Box Fuzzing by Modeling Program Behavior, Aug. 21, 2018, ACM, pp. 1-6. (Year: 2018).*
V. J. M. Manès et al., "The Art, Science, and Engineering of Fuzzing: A Survey," in IEEE Trans. SW Engg, Apr. 8, 2019, pp. 21.
A. Zeller et. al., "The Fuzzing Book: Tools & Techniques for Generating SW Tests", https://www.fuzzingbook.org/, Version 0.8.0 (released May 21, 2019), pp. 2.
V.-T. Pham, et. al., "AFLNET: A Greybox Fuzzer for Network Protocols," IEEE 13th Intl. Conf. on Software Testing, Validation and Verification (ICST), 2020, pp. 6.
A. Basiri, et al., "Automating chaos experiments in production" ICSE-SEIP 2019 https://doi.org/10.1109/ICSESEIP.2019.00012, May 12, 2019, pp. 10.

* cited by examiner

SYSTEMS AND METHODS FOR NETWORKED DEVICE TESTING

FIELD OF THE DISCLOSURE

This disclosure relates generally to testing of computing systems and, more particularly, to systems and methods for networked device testing.

BACKGROUND

Data centers, edge systems, computing systems, etc. employ a variety of hardware and software systems to execute computing workloads and tasks. Some of the hardware systems may be programmable systems such that a type of programming or software may control how the hardware system operates, processes data, etc. Some computing devices are programmable using domain-specific programming languages that include constructs optimized for particular types of hardware and tasks. For example, the Programming Protocol-independent Packet Processors (P4) domain-specific programming language is utilized for programming hardware for network data forwarding. Other types of domain-specific programming languages may include constructs optimized for other types of hardware or tasks.

BRIEF DESCRIPTION OF THE DRAWINGS

The figures are not to scale. In general, the same reference numbers will be used throughout the drawing(s) and accompanying written description to refer to the same or like parts.

Figure 1:
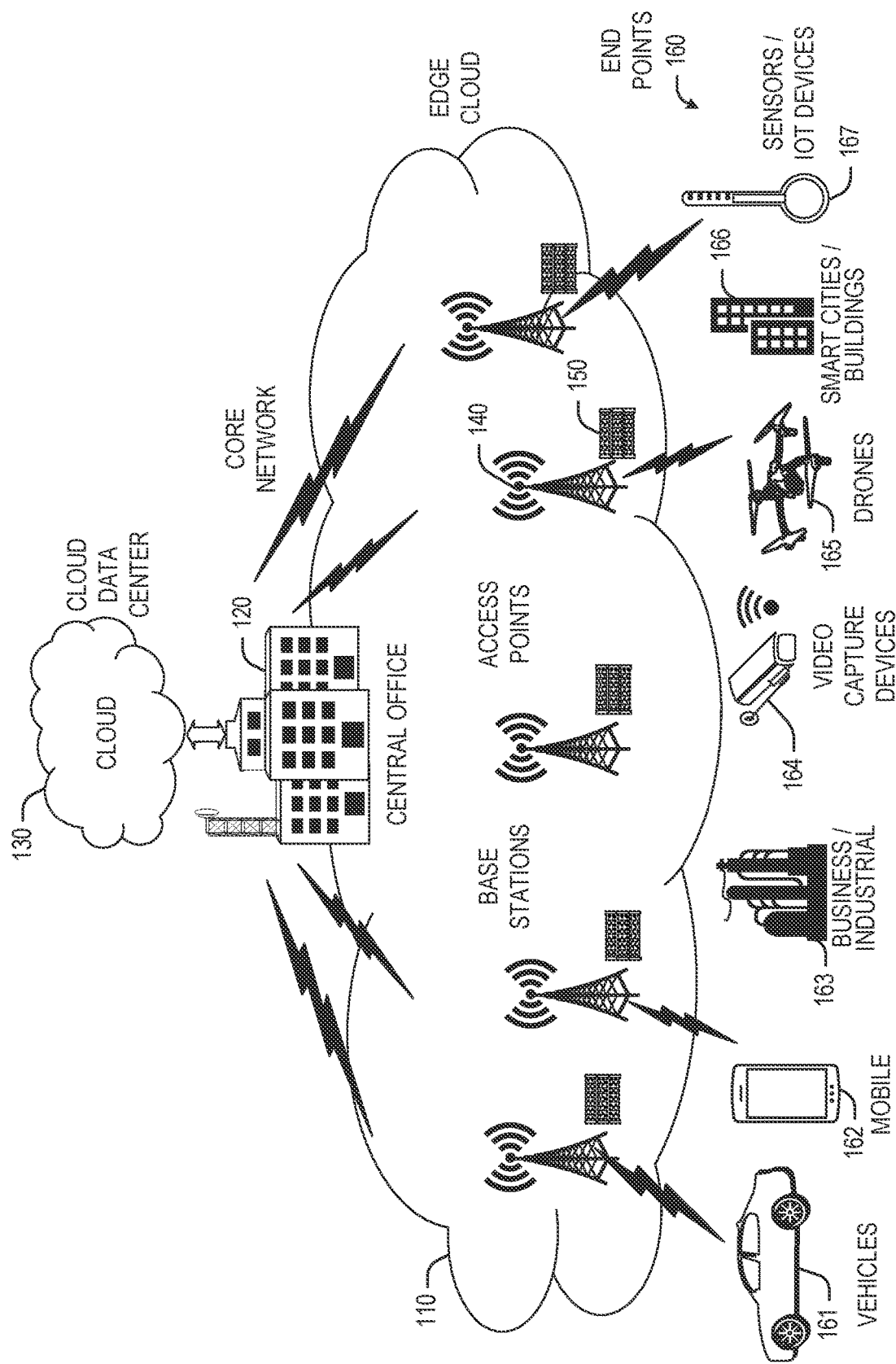
FIG. 1 illustrates an overview of an Edge cloud configuration for Edge computing.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time +/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

DETAILED DESCRIPTION

Fuzzing or fuzz testing of software comprises a rich body of techniques for mechanizing the generation and application of reasonable-looking but invalid inputs, or that of valid inputs that are rarely-likely to arise, in software programs. The goal of fuzz-testing is to rapidly and comprehensively identify software and security vulnerabilities, but to do so with a high benefit-to-cost ratio. Fuzz testing can provide the benefit of improving software code coverage and making software robust, while reducing the costs associated with human and computer time spent in creating and running tests. During typical development and debugging of a system by testing the system with unit-tests and stress-tests, one may fail to notice many kinds of gaps in the testing. In contrast, fuzz-testing can produce many mutations of tests that can expose those shortcomings missed during typical testing. Software fuzz testing is a very active field of research and product development.

Systems and methods disclosed herein utilize new techniques to apply software fuzzing to programmable devices (e.g., programmable network devices), protocols, and cluster operations. These techniques may be utilized, for example, with large scale cloud (both hyperscale public clouds and edge networks) operations with high rates of change of devices, security postures, network and security software, communication topologies, etc. Some techniques utilize software-driven fuzz-testing that is responsive to both historical coverage and dynamic changes in coverage.

Software controls networking at two levels: 1) at the level of resource provisioning, which can be thought of an "Infrastructure as Code" in modern software-defined infrastructure (SDI) systems, and 2) at the level of device operations through domain-specific programming. For example, P4 is a domain-specific language by which protocols for operation are programmed into network devices by upgrading their P4-based code (e.g., "Networking as Code"). Systems and methods disclosed herein utilize domain-specific programming (e.g., P4) and SDI as the transfer mechanisms for applying software testing techniques to systems (e.g., networks). Such systems and methods extend the state-of-the-art approaches for fuzz-testing of networks and other systems.

Systems and methods disclosed herein utilize new techniques to employ dynamic feedback-based fuzzing, route-exploration scripts to continuously bias new test inputs (e.g., test parameters) based on changes in network conditions and configurations are described. In some examples, software fuzz-testing is mapped to network protocols and devices by using P4-based representation of the network protocols and devices. Gaps between formal specifications of networking behaviors and the actual implementations in P4 may be identified and used to shape test sets. Sandboxes may be created, using P4, to conduct testing at varying levels of granularity alongside the rest of the network that is not under test. Subsequently, the sandboxing can be dropped and applied to some other part of the network that is updated and tested.

FIG. 1 is a block diagram 100 showing an overview of a configuration for Edge computing, which includes a layer of processing referred to in many of the following examples as an "Edge cloud". As shown, the Edge cloud 110 is co-located at an Edge location, such as an access point or base station 140, a local processing hub 150, or a central office 120, and thus may include multiple entities, devices, and equipment instances. The Edge cloud 110 is located much closer to the endpoint (consumer and producer) data sources 160 (e.g., autonomous vehicles 161, user equipment 162, business and industrial equipment 163, video capture devices 164, drones 165, smart cities and building devices 166, sensors and IoT devices 167, etc.) than the cloud data center 130. Compute, memory, and storage resources which are offered at the edges in the Edge cloud 110 are critical to providing ultra-low latency response times for services and functions used by the endpoint data sources 160 as well as reduce network backhaul traffic from the Edge cloud 110 toward cloud data center 130 thus improving energy consumption and overall network usages among other benefits.

Compute, memory, and storage are scarce resources, and generally decrease depending on the Edge location (e.g., fewer processing resources being available at consumer endpoint devices, than at a base station, than at a central office). However, the closer that the Edge location is to the endpoint (e.g., user equipment (UE)), the more that space and power is often constrained. Thus, Edge computing attempts to reduce the amount of resources needed for network services, through the distribution of more resources which are located closer both geographically and in network access time. In this manner, Edge computing attempts to bring the compute resources to the workload data where appropriate, or, bring the workload data to the compute resources.

The following describes aspects of an Edge cloud architecture that covers multiple potential deployments and addresses restrictions that some network operators or service providers may have in their own infrastructures. These include, variation of configurations based on the Edge location (because edges at a base station level, for instance, may have more constrained performance and capabilities in a multi-tenant scenario); configurations based on the type of compute, memory, storage, fabric, acceleration, or like resources available to Edge locations, tiers of locations, or groups of locations; the service, security, and management and orchestration capabilities; and related objectives to achieve usability and performance of end services. These deployments may accomplish processing in network layers that may be considered as "near Edge", "close Edge", "local Edge", "middle Edge", or "far Edge" layers, depending on latency, distance, and timing characteristics.

Edge computing is a developing paradigm where computing is performed at or closer to the "Edge" of a network, typically through the use of a compute platform (e.g., x86 or ARM compute hardware architecture) implemented at base stations, gateways, network routers, or other devices which are much closer to endpoint devices producing and consuming the data. For example, Edge gateway servers may be equipped with pools of memory and storage resources to perform computation in real-time for low latency use-cases (e.g., autonomous driving or video surveillance) for connected client devices. Or as an example, base stations may be augmented with compute and acceleration resources to directly process service workloads for connected user equipment, without further communicating data via backhaul networks. Or as another example, central office network management hardware may be replaced with standardized compute hardware that performs virtualized network functions and offers compute resources for the execution of services and consumer functions for connected devices. Within Edge computing networks, there may be scenarios in services which the compute resource will be "moved" to the data, as well as scenarios in which the data will be "moved" to the compute resource. Or as an example, base station compute, acceleration and network resources can provide services in order to scale to workload demands on an as needed basis by activating dormant capacity (subscription, capacity on demand) in order to manage corner cases, emergencies or to provide longevity for deployed resources over a significantly longer implemented lifecycle.

Figure 2:
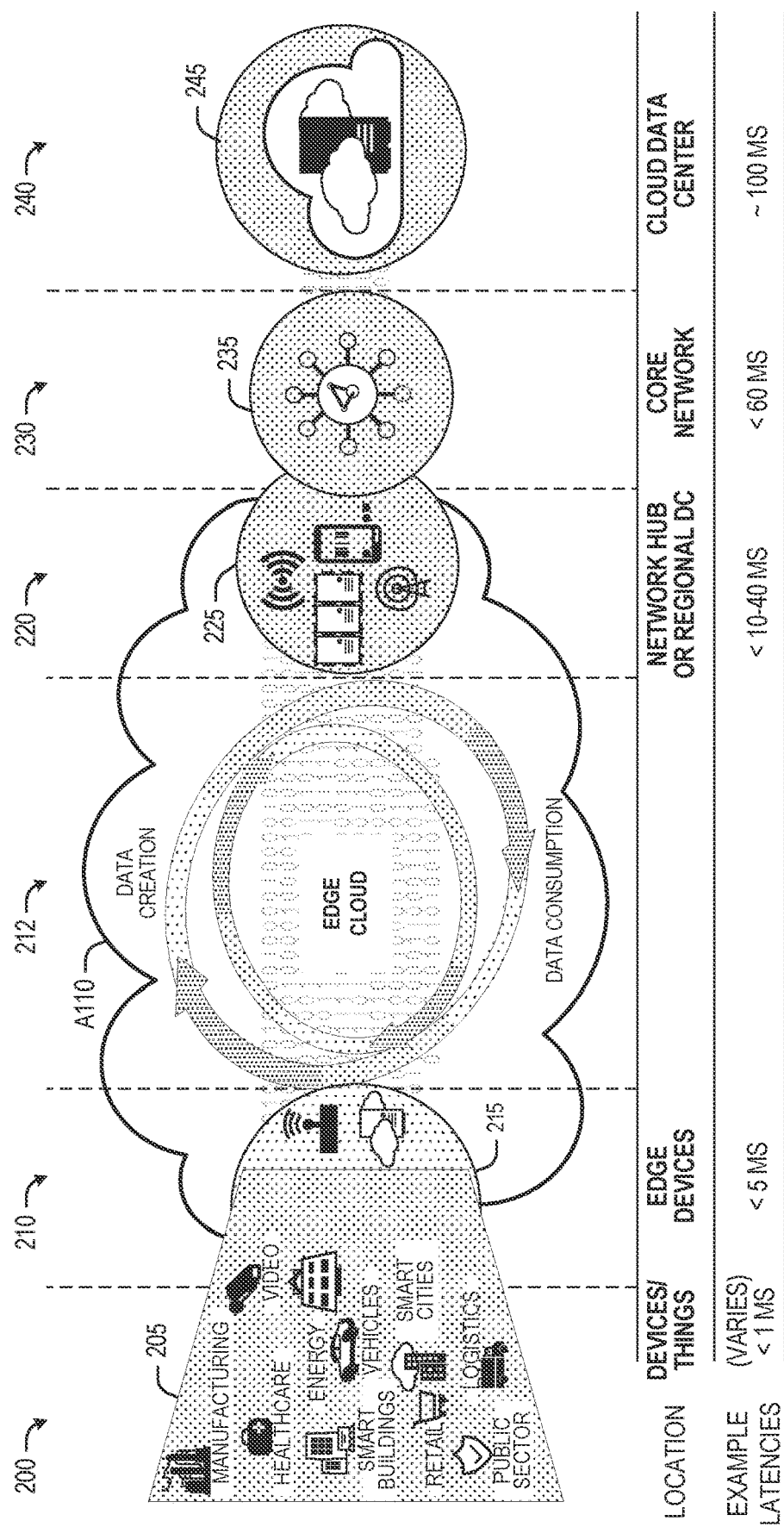
FIG. 2 illustrates operational layers among endpoints, an Edge cloud, and cloud computing environments.

FIG. 2 illustrates operational layers among endpoints, an Edge cloud, and cloud computing environments. Specifically, FIG. 2 depicts examples of computational use cases 205, utilizing the Edge cloud 110 among multiple illustrative layers of network computing. The layers begin at an endpoint (devices and things) layer 200, which accesses the Edge cloud 110 to conduct data creation, analysis, and data consumption activities. The Edge cloud 110 may span multiple network layers, such as an Edge devices layer 210 having gateways, on-premise servers, or network equipment (nodes 215) located in physically proximate Edge systems; a network access layer 220, encompassing base stations, radio processing units, network hubs, regional data centers (DC), or local network equipment (equipment 225); and any equipment, devices, or nodes located therebetween (in layer 212, not illustrated in detail). The network communications within the Edge cloud 110 and among the various layers may occur via any number of wired or wireless mediums, including via connectivity architectures and technologies not depicted.

Examples of latency, resulting from network communication distance and processing time constraints, may range from less than a millisecond (ms) when among the endpoint layer 200, under 5 ms at the Edge devices layer 210, to even between 10 to 40 ms when communicating with nodes at the network access layer 220. Beyond the Edge cloud 110 are core network 230 and cloud data center 240 layers, each with increasing latency (e.g., between 50-60 ms at the core network layer 230, to 100 or more ms at the cloud data center layer). As a result, operations at a core network data center 235 or a cloud data center 245, with latencies of at least 50 to 100 ms or more, will not be able to accomplish many time-critical functions of the use cases 205. Each of these latency values are provided for purposes of illustration and contrast; it will be understood that the use of other access network mediums and technologies may further reduce the latencies. In some examples, respective portions of the network may be categorized as "close Edge", "local Edge", "near Edge", "middle Edge", or "far Edge" layers, relative to a network source and destination. For instance, from the perspective of the core network data center 235 or a cloud data center 245, a central office or content data network may be considered as being located within a "near Edge" layer ("near" to the cloud, having high latency values when communicating with the devices and endpoints of the use cases 205), whereas an access point, base station, on-premise server, or network gateway may be considered as located within a "far Edge" layer ("far" from the cloud, having low latency values when communicating with the devices and endpoints of the use cases 205). It will be understood that other categorizations of a particular network layer as constituting a "close", "local", "near", "middle", or "far" Edge may be based on latency, distance, number of network hops, or other measurable characteristics, as measured from a source in any of the network layers 200-240.

The various use cases 205 may access resources under usage pressure from incoming streams, due to multiple services utilizing the Edge cloud. To achieve results with low latency, the services executed within the Edge cloud 110 balance varying requirements in terms of: (a) Priority (throughput or latency) and Quality of Service (QoS) (e.g., traffic for an autonomous car may have higher priority than a temperature sensor in terms of response time requirement; or, a performance sensitivity/bottleneck may exist at a compute/accelerator, memory, storage, or network resource, depending on the application); (b) Reliability and Resiliency (e.g., some input streams need to be acted upon and the traffic routed with mission-critical reliability, where as some other input streams may be tolerate an occasional failure, depending on the application); and (c) Physical constraints (e.g., power, cooling and form-factor, etc.).

The end-to-end service view for these use cases involves the concept of a service-flow and is associated with a transaction. The transaction details the overall service requirement for the entity consuming the service, as well as the associated services for the resources, workloads, workflows, and business functional and business level requirements. The services executed with the "terms" described may be managed at each layer in a way to assure real time, and runtime contractual compliance for the transaction during the lifecycle of the service. When a component in the transaction is missing its agreed to Service Level Agreement (SLA), the system as a whole (components in the transaction) may provide the ability to (1) understand the impact of the SLA violation, and (2) augment other components in the system to resume overall transaction SLA, and (3) implement steps to remediate.

Thus, with these variations and service features in mind, Edge computing within the Edge cloud 110 may provide the ability to serve and respond to multiple applications of the use cases 205 (e.g., object tracking, video surveillance, connected cars, etc.) in real-time or near real-time, and meet ultra-low latency requirements for these multiple applications. These advantages enable a whole new class of applications (e.g., Virtual Network Functions (VNFs), Function as a Service (FaaS), Edge as a Service (EaaS), standard processes, etc.), which cannot leverage conventional cloud computing due to latency or other limitations.

However, with the advantages of Edge computing comes the following caveats. The devices located at the Edge are often resource constrained and therefore there is pressure on usage of Edge resources. Typically, this is addressed through the pooling of memory and storage resources for use by multiple users (tenants) and devices. The Edge may be power and cooling constrained and therefore the power usage needs to be accounted for by the applications that are consuming the most power. There may be inherent power-performance tradeoffs in these pooled memory resources, as many of them are likely to use emerging memory technologies, where more power requires greater memory bandwidth. Likewise, improved security of hardware and root of trust trusted functions are also required, because Edge locations may be unmanned and may even need permissioned access (e.g., when housed in a third-party location). Such issues are magnified in the Edge cloud 110 in a multi-tenant, multi-owner, or multi-access setting, where services and applications are requested by many users, especially as network usage dynamically fluctuates and the composition of the multiple stakeholders, use cases, and services changes.

At a more generic level, an Edge computing system may be described to encompass any number of deployments at the previously discussed layers operating in the Edge cloud 110 (network layers 200-240), which provide coordination from client and distributed computing devices. One or more Edge gateway nodes, one or more Edge aggregation nodes, and one or more core data centers may be distributed across layers of the network to provide an implementation of the Edge computing system by or on behalf of a telecommunication service provider ("telco", or "TSP"), internet-of-things service provider, cloud service provider (CSP), enterprise entity, or any other number of entities. Various implementations and configurations of the Edge computing system may be provided dynamically, such as when orchestrated to meet service objectives.

Consistent with the examples provided herein, a client compute node may be embodied as any type of endpoint component, device, appliance, or other thing capable of communicating as a producer or consumer of data. Further, the label "node" or "device" as used in the Edge computing system does not necessarily mean that such node or device operates in a client or agent/minion/follower role; rather, any of the nodes or devices in the Edge computing system refer to individual entities, nodes, or subsystems which include discrete or connected hardware or software configurations to facilitate or use the Edge cloud 110.

As such, the Edge cloud 110 is formed from network components and functional features operated by and within Edge gateway nodes, Edge aggregation nodes, or other Edge compute nodes among network layers 210-230. The Edge cloud 110 thus may be embodied as any type of network that provides Edge computing and/or storage resources which are proximately located to radio access network (RAN) capable endpoint devices (e.g., mobile computing devices, IoT devices, smart devices, etc.), which are discussed herein. In other words, the Edge cloud 110 may be envisioned as an "Edge" which connects the endpoint devices and traditional network access points that serve as an ingress point into service provider core networks, including mobile carrier networks (e.g., Global System for Mobile Communications (GSM) networks, Long-Term Evolution (LTE) networks, 5G/6G networks, etc.), while also providing storage and/or compute capabilities. Other types and forms of network access (e.g., Wi-Fi, long-range wireless, wired networks including optical networks, etc.) may also be utilized in place of or in combination with such 3GPP carrier networks.

The network components of the Edge cloud 110 may be servers, multi-tenant servers, appliance computing devices, and/or any other type of computing devices. For example, the Edge cloud 110 may include an appliance computing device that is a self-contained electronic device including a housing, a chassis, a case, or a shell. In some circumstances, the housing may be dimensioned for portability such that it can be carried by a human and/or shipped. Example housings may include materials that form one or more exterior surfaces that partially or fully protect contents of the appliance, in which protection may include weather protection, hazardous environment protection (e.g., electromagnetic interference (EMI), vibration, extreme temperatures, etc.), and/or enable submergibility. Example housings may include power circuitry to provide power for stationary and/or portable implementations, such as alternating current (AC) power inputs, direct current (DC) power inputs, AC/DC converter(s), DC/AC converter(s), DC/DC converter(s), power regulators, transformers, charging circuitry, batteries, wired inputs, and/or wireless power inputs. Example housings and/or surfaces thereof may include or connect to mounting hardware to enable attachment to structures such as buildings, telecommunication structures (e.g., poles, antenna structures, etc.), and/or racks (e.g., server racks, blade mounts, etc.). Example housings and/or surfaces thereof may support one or more sensors (e.g., temperature sensors, vibration sensors, light sensors, acoustic sensors, capacitive sensors, proximity sensors, infrared or other visual thermal sensors, etc.). One or more such sensors may be contained in, carried by, or otherwise embedded in the surface and/or mounted to the surface of the appliance. Example housings and/or surfaces thereof may support mechanical connectivity, such as propulsion hardware (e.g., wheels, rotors such as propellers, etc.) and/or articulating hardware (e.g., robot arms, pivotable appendages, etc.). In some circumstances, the sensors may include any type of input devices such as user interface hardware (e.g., buttons, switches, dials, sliders, microphones, etc.). In some circumstances, example housings include output devices contained in, carried by, embedded therein and/or attached thereto. Output devices may include displays, touchscreens, lights, light-emitting diodes (LEDs), speakers, input/output (I/O) ports (e.g., universal serial bus (USB)), etc. In some circumstances, Edge devices are devices presented in the network for a specific purpose (e.g., a traffic light), but may have processing and/or other capacities that may be utilized for other purposes. Such Edge devices may be independent from other networked devices and may be provided with a housing having a form factor suitable for its primary purpose; yet be available for other compute tasks that do not interfere with its primary task. Edge devices include Internet of Things devices. The appliance computing device may include hardware and software components to manage local issues such as device temperature, vibration, resource utilization, updates, power issues, physical and network security, etc. Example hardware for implementing an appliance computing device is described in conjunction with FIG. 15. The Edge cloud 110 may also include one or more servers and/or one or more multi-tenant servers. Such a server may include an operating system and implement a virtual computing environment. A virtual computing environment may include a hypervisor managing (e.g., spawning, deploying, commissioning, destroying, decommissioning, etc.) one or more virtual machines, one or more containers, etc. Such virtual computing environments provide an execution environment in which one or more applications and/or other software, code, or scripts may execute while being isolated from one or more other applications, software, code, or scripts.

Figure 3:
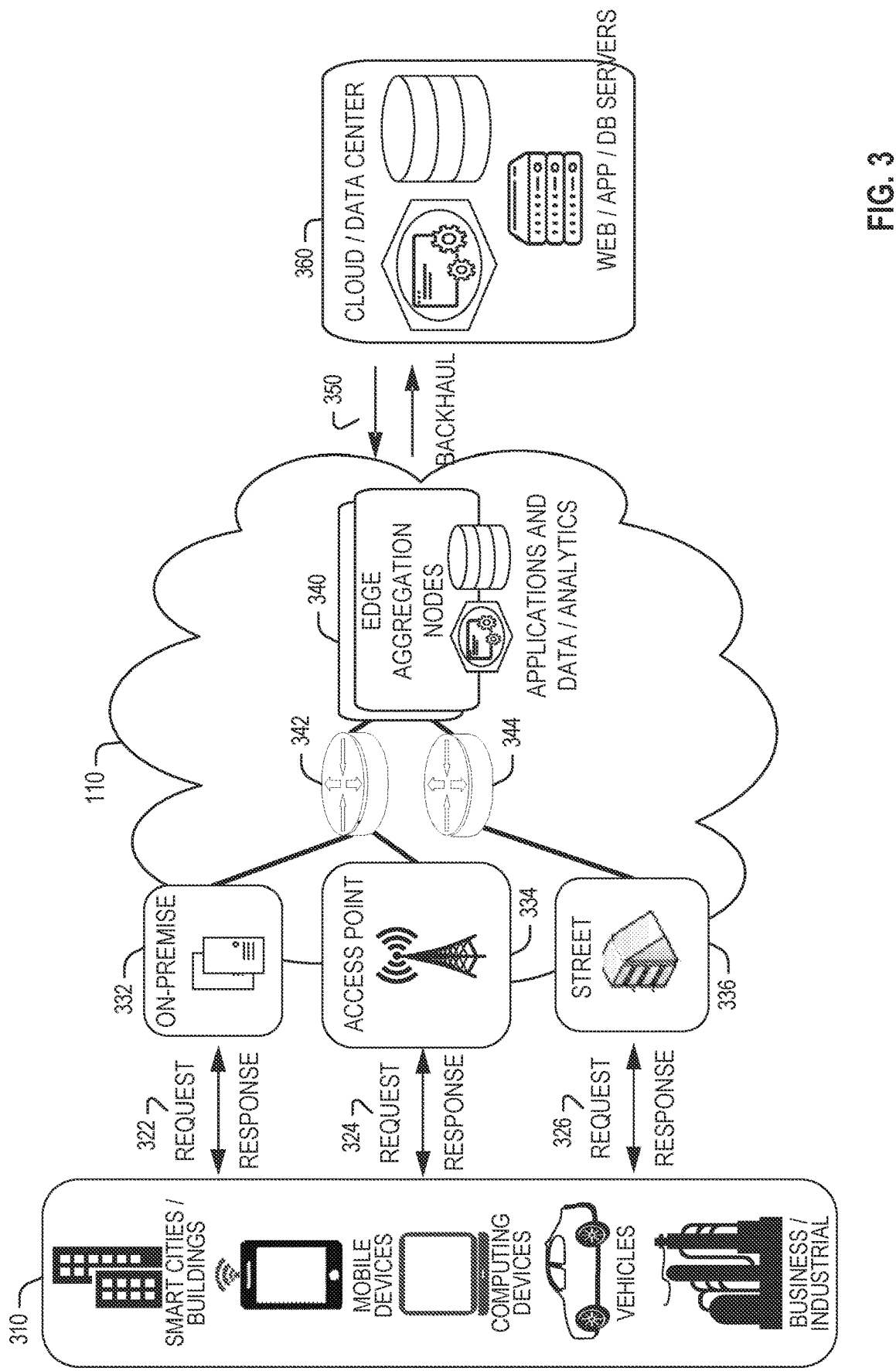
FIG. 3 illustrates an example approach for networking and services in an Edge computing system.

In FIG. 3, various client endpoints 310 (in the form of mobile devices, computers, autonomous vehicles, business computing equipment, industrial processing equipment) exchange requests and responses that are specific to the type of endpoint network aggregation. For instance, client endpoints 310 may obtain network access via a wired broadband network, by exchanging requests and responses 322 through an on-premise network system 332. Some client endpoints 310, such as mobile computing devices, may obtain network access via a wireless broadband network, by exchanging requests and responses 324 through an access point (e.g., a cellular network tower) 334. Some client endpoints 310, such as autonomous vehicles may obtain network access for requests and responses 326 via a wireless vehicular network through a street-located network system 336. However, regardless of the type of network access, the TSP may deploy aggregation points 342, 344 within the Edge cloud 110 to aggregate traffic and requests. Thus, within the Edge cloud 110, the TSP may deploy various compute and storage resources, such as at Edge aggregation nodes 340, to provide requested content. The Edge aggregation nodes 340 and other systems of the Edge cloud 110 are connected to a cloud or data center 360, which uses a backhaul network 350 to fulfill higher-latency requests from a cloud/data center for websites, applications, database servers, etc. Additional or consolidated instances of the Edge aggregation nodes 340 and the aggregation points 342, 344, including those deployed on a single server framework, may also be present within the Edge cloud 110 or other areas of the TSP infrastructure.

Figure 4:
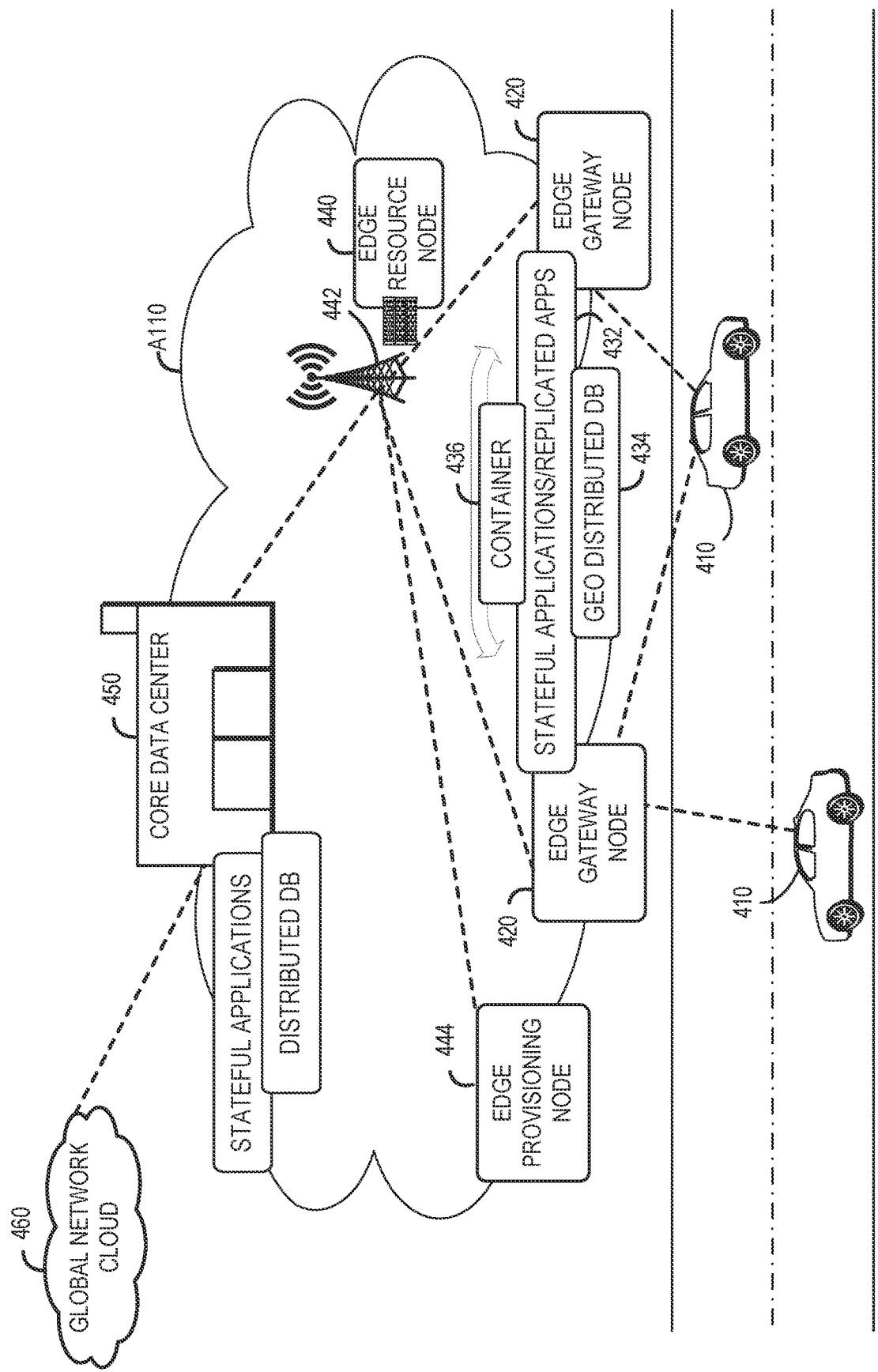
FIG. 4 illustrates a compute and communication use case involving mobile access to applications in an Edge computing system.

It should be appreciated that the Edge computing systems and arrangements discussed herein may be applicable in various solutions, services, and/or use cases involving mobility. As an example, FIG. 4 shows a simplified vehicle compute and communication use case involving mobile access to applications in an Edge computing system 400 that implements an Edge cloud 110. In this use case, respective client compute nodes 410 may be embodied as in-vehicle compute systems (e.g., in-vehicle navigation and/or infotainment systems) located in corresponding vehicles which communicate with the Edge gateway nodes 420 during traversal of a roadway. For instance, the Edge gateway nodes 420 may be located in a roadside cabinet or other enclosure built-into a structure having other, separate, mechanical utility, which may be placed along the roadway, at intersections of the roadway, or other locations near the roadway. As respective vehicles traverse along the roadway, the connection between its client compute node 410 and a particular Edge gateway device 420 may propagate so as to maintain a consistent connection and context for the client compute node 410. Likewise, mobile Edge nodes may aggregate at the high priority services or according to the throughput or latency resolution requirements for the underlying service(s) (e.g., in the case of drones). The respective Edge gateway devices 420 include an amount of processing and storage capabilities and, as such, some processing and/or storage of data for the client compute nodes 410 may be performed on one or more of the Edge gateway devices 420.

The Edge gateway devices 420 may communicate with one or more Edge resource nodes 440, which are illustratively embodied as compute servers, appliances or components located at or in a communication base station 442 (e.g., a base station of a cellular network). As discussed above, the respective Edge resource nodes 440 include an amount of processing and storage capabilities and, as such, some processing and/or storage of data for the client compute nodes 410 may be performed on the Edge resource node 440. For example, the processing of data that is less urgent or important may be performed by the Edge resource node 440, while the processing of data that is of a higher urgency or importance may be performed by the Edge gateway devices 420 (depending on, for example, the capabilities of each component, or information in the request indicating urgency or importance). Based on data access, data location or latency, work may continue on Edge resource nodes when the processing priorities change during the processing activity. Likewise, configurable systems or hardware resources themselves can be activated (e.g., through a local orchestrator) to provide additional resources to meet the new demand (e.g., adapt the compute resources to the workload data).

The Edge resource node(s) 440 also communicate with the core data center 450, which may include compute servers, appliances, and/or other components located in a central location (e.g., a central office of a cellular communication network). The core data center 450 may provide a gateway to the global network cloud 460 (e.g., the Internet) for the Edge cloud 110 operations formed by the Edge resource node(s) 440 and the Edge gateway devices 420. Additionally, in some examples, the core data center 450 may include an amount of processing and storage capabilities and, as such, some processing and/or storage of data for the client compute devices may be performed on the core data center 450 (e.g., processing of low urgency or importance, or high complexity).

The Edge gateway nodes 420 or the Edge resource nodes 440 may offer the use of stateful applications 432 and a geographic distributed database 434. Although the applications 432 and database 434 are illustrated as being horizontally distributed at a layer of the Edge cloud 110, it will be understood that resources, services, or other components of the application may be vertically distributed throughout the Edge cloud (including, part of the application executed at the client compute node 410, other parts at the Edge gateway nodes 420 or the Edge resource nodes 440, etc.). Additionally, as stated previously, there can be peer relationships at any level to meet service objectives and obligations. Further, the data for a specific client or application can move from Edge to Edge based on changing conditions (e.g., based on acceleration resource availability, following the car movement, etc.). For instance, based on the "rate of decay" of access, prediction can be made to identify the next owner to continue, or when the data or computational access will no longer be viable. These and other services may be utilized to complete the work that is needed to keep the transaction compliant and lossless.

In further scenarios, a container 436 (or pod of containers) may be flexibly migrated from an Edge node 420 to other Edge nodes (e.g., 420, 440, etc.) such that the container with an application and workload does not need to be reconstituted, re-compiled, re-interpreted in order for migration to work. However, in such settings, there may be some remedial or "swizzling" translation operations applied. For example, the physical hardware at node 440 may differ from Edge gateway node 420 and therefore, the hardware abstraction layer (HAL) that makes up the bottom Edge of the container will be re-mapped to the physical layer of the target Edge node. This may involve some form of late-binding technique, such as binary translation of the HAL from the container native format to the physical hardware format, or may involve mapping interfaces and operations. A pod controller may be used to drive the interface mapping as part of the container lifecycle, which includes migration to/from different hardware environments.

The scenarios encompassed by FIG. 4 may utilize various types of mobile Edge nodes, such as an Edge node hosted in a vehicle (e.g., a car, truck, tram, train, etc.) or other mobile unit, as the Edge node will move to other geographic locations along the platform hosting it. With vehicle-to-vehicle communications, individual vehicles may even act as network Edge nodes for other cars, (e.g., to perform caching, reporting, data aggregation, etc.). Thus, it will be understood that the application components provided in various Edge nodes may be distributed in static or mobile settings, including coordination between some functions or operations at individual endpoint devices or the Edge gateway nodes 420, some others at the Edge resource node 440, and others in the core data center 450 or global network cloud 460.

In further configurations, the Edge computing system may implement FaaS computing capabilities through the use of respective executable applications and functions. In an example, a developer writes function code (e.g., "computer code" herein) representing one or more computer functions, and the function code is uploaded to a FaaS platform provided by, for example, an Edge node or data center. A trigger such as, for example, a service use case or an Edge processing event, initiates the execution of the function code with the FaaS platform.

In an example of FaaS, a container is used to provide an environment in which function code (e.g., an application which may be provided by a third party) is executed. The container may be any isolated-execution entity such as a process, a Docker or Kubernetes container, a virtual machine, etc. Within the Edge computing system, various datacenter, Edge, and endpoint (including mobile) devices are used to "spin up" functions (e.g., activate and/or allocate function actions) that are scaled on demand. The function code gets executed on the physical infrastructure (e.g., Edge computing node) device and underlying virtualized containers. Finally, the function(s) is/are "spun down" (e.g., deactivated and/or deallocated) on the infrastructure in response to the execution being completed.

Further aspects of FaaS may enable deployment of Edge functions in a service fashion, including a support of respective functions that support Edge computing as a service (Edge-as-a-Service or "EaaS"). Additional features of FaaS may include: a granular billing component that enables customers (e.g., computer code developers) to pay only when their code gets executed; common data storage to store data for reuse by one or more functions; orchestration and management among individual functions; function execution management, parallelism, and consolidation; management of container and function memory spaces; coordination of acceleration resources available for functions; and distribution of functions between containers (including "warm" containers, already deployed or operating, versus "cold" which require initialization, deployment, or configuration).

The Edge computing system 400 can include or be in communication with an Edge provisioning node 444. The Edge provisioning node 444 can distribute software such as the example machine (e.g., computer) readable instructions 1532 of FIG. 15, to various receiving parties for implementing any of the methods described herein. The example Edge provisioning node 444 may be implemented by any computer server, home server, content delivery network, virtual server, software distribution system, central facility, storage device, storage disk, storage node, data facility, cloud service, etc., capable of storing and/or transmitting software instructions (e.g., code, scripts, executable binaries, containers, packages, compressed files, and/or derivatives thereof) to other computing devices. Component(s) of the example Edge provisioning node 444 may be located in a cloud, in a local area network, in an Edge network, in a wide area network, on the Internet, and/or any other location communicatively coupled with the receiving party(ies). The receiving parties may be customers, clients, associates, users, etc. of the entity owning and/or operating the Edge provisioning node 444. For example, the entity that owns and/or operates the Edge provisioning node 444 may be a developer, a seller, and/or a licensor (or a customer and/or consumer thereof) of software instructions such as the example computer readable instructions 1532 of FIG. 15. The receiving parties may be consumers, service providers, users, retailers, OEMs, etc., who purchase and/or license the software instructions for use and/or re-sale and/or sub-licensing.

In an example, Edge provisioning node 444 includes one or more servers and one or more storage devices/disks. The storage devices and/or storage disks host computer readable instructions such as the example computer readable instructions 1532 of FIG. 15, as described below. Similarly to Edge gateway devices 420 described above, the one or more servers of the Edge provisioning node 444 are in communication with a base station 442 or other network communication entity. In some examples, the one or more servers are responsive to requests to transmit the software instructions to a requesting party as part of a commercial transaction. Payment for the delivery, sale, and/or license of the software instructions may be handled by the one or more servers of the software distribution platform and/or via a third-party payment entity. The servers enable purchasers and/or licensors to download the computer readable instructions 1532 from the Edge provisioning node 444. For example, the software instructions, which may correspond to the example computer readable instructions 1432 of FIG. 15, may be downloaded to the example processor platform/s, which is to execute the computer readable instructions to implement the methods described herein.

In some examples, the processor platform(s) that execute the computer readable instructions can be physically located in different geographic locations, legal jurisdictions, etc. In some examples, one or more servers of the Edge provisioning node 444 periodically offer, transmit, and/or force updates to the software instructions (e.g., the example computer readable instructions 1532 of FIG. 15) to ensure improvements, patches, updates, etc. are distributed and applied to the software instructions implemented at the end user devices. In some examples, different components of the computer readable instructions can be distributed from different sources and/or to different processor platforms; for example, different libraries, plug-ins, components, and other types of compute modules, whether compiled or interpreted, can be distributed from different sources and/or to different processor platforms. For example, a portion of the software instructions (e.g., a script that is not, in itself, executable) may be distributed from a first source while an interpreter (capable of executing the script) may be distributed from a second source.

Systems and methods disclosed herein may be utilized for testing of any components of the computing systems illustrated in FIGS. 1-4. For example, a network device within the edge cloud 110 may be tested.

Figure 5:
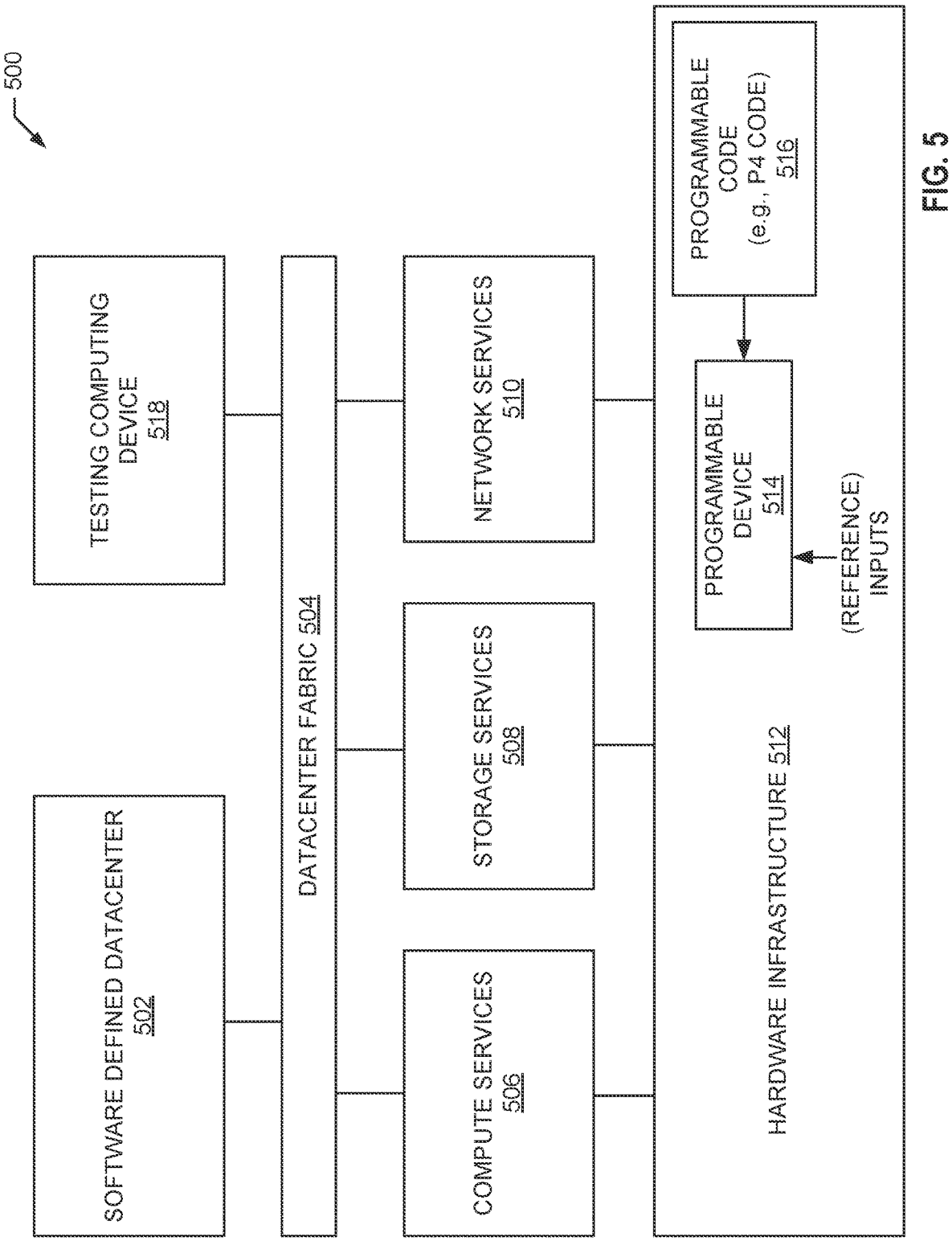
FIG. 5 illustrates an example computing system that includes a testing computing device to coordinate testing within a computing system.

FIG. 5 illustrates an example computing system 500 that includes a testing computing device 518 to coordinate testing within a computing system. The example computing system 500 is a software-defined computing system that is controlled by the software defined datacenter 502. The example computing system 500 includes the example software defined datacenter 502, example datacenter fabric 504, example compute services 506, example storage services 508, example network services 510, example hardware infrastructure that includes an example programmable device 514 with programmable code 516, and the example testing computing device 518. While FIG. 5 illustrates a datacenter, the programmable device 514 may be a networked device in any type of computer system such as an edge system, a cloud system, a local device system (e.g., a vehicle), etc. Furthermore, the systems and methods disclosed herein may be applied to such a programmable device 514 located in any type of computing system including those noted above.

The software defined datacenter 502 includes the software systems for controlling and coordinating the operation of the computing system 500. The example datacenter fabric 504 is the networking components that communicatively couples the various components of the computing system 500. The example compute services 506 provide virtualization of the computing resources such as processing resources. The example storage services 508 provide virtualization of storage resources (e.g., data storage resources). The example network services 510 provide virtualization of physical network resources to divide the resources among requesting workloads.

The example hardware infrastructure 512 is the physical devices (e.g., servers, processors, memory, storage, network components, etc.) that make up the example computing system 500 and are virtualized by the services 506, 508, 510. For purposes of description, the example hardware infrastructure 512 is depicted to include the programmable device 514. The example programmable device 514 is a programmable network device (e.g., a switch, router, etc.) that is programmed by the example programmable code 516 (e.g., P4 Code).

The example testing computing device 518 operates according to the systems and methods described herein to control and conduct testing of computing systems such as the example programmable device 514. The example testing computing device 518 is a virtual machine executing within the environment controlled by the software defined datacenter 502. Alternatively, the testing computing device 518 may be implemented by a dedicated computing device (e.g., a server), may be implemented on an embedded device, a personal computer, or any of the other devices described herein.

Figure 6:
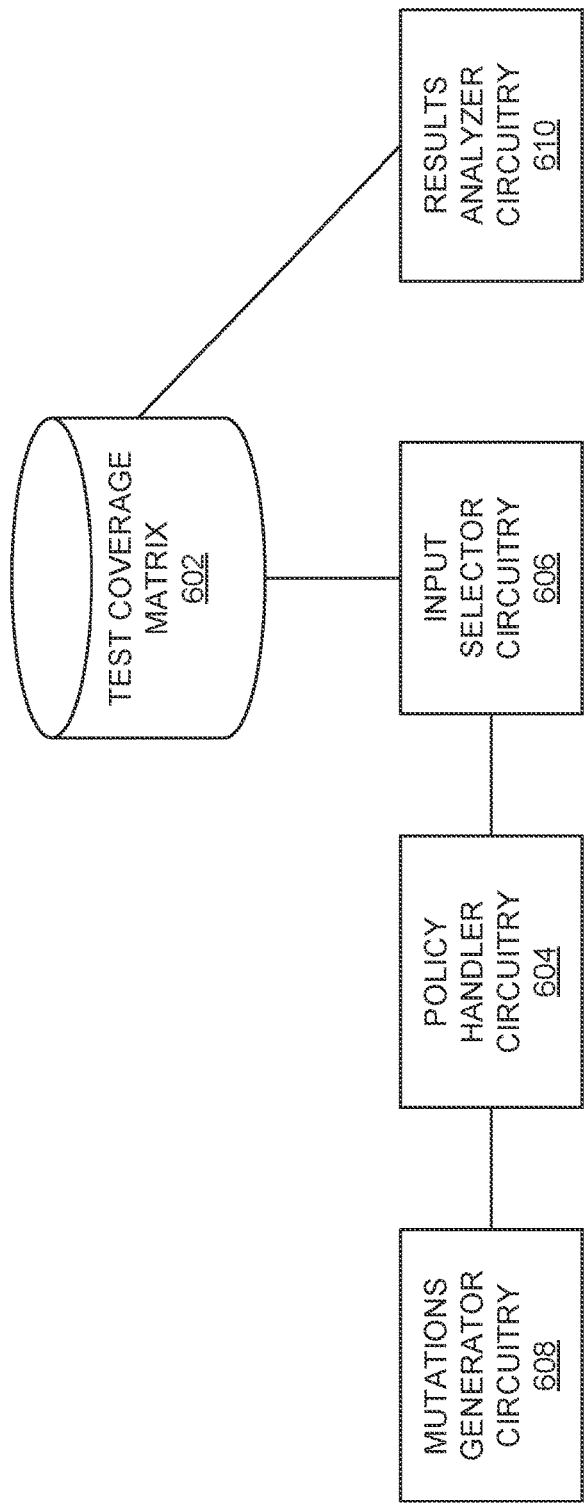
FIG. 6 is a block diagram of an example implementation of the testing computing device.

FIG. 6 is a block diagram of an example implementation of the testing computing device 518. According to the illustrated example, the testing computing device 518 includes an example test coverage matrix 602, an example policy handler circuitry 604, an example input selector circuitry 606, an example mutations generator circuitry 608, and an example results analyzer circuitry 610.

The example test coverage matrix 602 is a database. However, the test coverage matrix 602 may be implemented by any type of storage or memory device. The example test coverage matrix 602 includes P4 code coverage, device and network states, inputs stored and indexed, and expected errors and indications. While a single test coverage matrix 602 is illustrated in FIG. 6, any number of test coverage matrices and/or storage systems may be utilized. Furthermore, while the example testing computing server 518 includes the example test coverage matrix 602, the example testing computing server 518 may additionally or alternatively access a test coverage matrix that is stored externally/remotely from the testing computing server 518.

In some examples, the testing computing server 518 includes means for storing. For example, the means for storing may be implemented by the test coverage matrix 602. In some examples, the test coverage matrix 602 may be implemented by memory, disk storage, cache memory, or any other type of memory or storage structured to store data.

The example policy handler circuitry 604 manages and applies testing policies and procedures. For example, the policy handler circuitry 604 of the illustrated example determines sequences of tests, determines sequences of mutations to be performed by the mutations generator circuitry 608, applies the determined tests and mutations of tests, etc.

In some examples, the testing computing device 518 includes means for policy handling. For example, the means for policy handling may be implemented by the policy handler circuitry 604. In some examples, the policy handler circuitry 604 may be implemented by machine executable instructions such as that implemented by at least blocks 830-832 of FIG. 8 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the policy handler circuitry 604 is implemented by other hardware logic circuitry, hardware implemented state machines, and/or any other combination of hardware, software, and/or firmware. For example, the policy handler circuitry 604 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

The example input selector circuitry 606 selects test inputs (e.g., test parameters) from the test coverage matrix 602 based on the policies handled by the policy handler circuitry 604.

In some examples, the testing computing device 518 includes means for input selection. For example, the means for input selection may be implemented by the input selector circuitry 606. In some examples, the input selector circuitry 606 may be implemented by machine executable instructions such as that implemented by at least blocks 802-804 and 820 of FIG. 8 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the input selector circuitry 606 is implemented by other hardware logic circuitry, hardware implemented state machines, and/or any other combination of hardware, software, and/or firmware. For example, the input selector circuitry 606 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

The example mutations generator circuitry 608 generates mutations and tests and/or inputs. The mutations generator circuitry 608 may utilize any techniques to generate mutations over seed inputs (e.g., genetic methods, simulated annealing, generative adversarial network (GAN), recurrent deep learning, etc.). The amount of exploration (P) and the degree of mutation (EI) may be determined by the policy handler circuitry 604 in accordance with the process illustrated in FIG. 7 and such parameters are passed to the mutations generator circuitry 608 for use in generating a mutated input.

In some examples, the testing computing device 518 includes means for mutations generation. For example, the means for mutations generation may be implemented by the mutations generator circuitry 608. In some examples, the mutations generator circuitry 608 may be implemented by machine executable instructions such as that implemented by at least blocks 816 of FIG. 8 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the policy handler circuitry 604 is implemented by other hardware logic circuitry, hardware implemented state machines, and/or any other combination of hardware, software, and/or firmware. For example, the mutations generator circuitry 608 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

The example results analyzer circuitry 610 analyzes the results of testing to determine and direct next steps. For example, the results analyzer circuitry 610 may determine that a test input successfully transitions a device to an expected state and, thus, record the test input in the test coverage matrix 602. The results analyzer circuitry 610 may determine that the test input causes an error that is properly handled (e.g., doesn't crash, an error notification is presented, etc.) by the device and, thus, record the test input in the test coverage matrix 602 indicating that the test input is useful for testing invalid inputs that should properly be handled. The results analyzer circuitry 610 may additionally provide notifications of issues with test inputs. For example, if a test input is not handled properly by a device, the results analyzer circuitry 610 may provide notification for a user/administrator to review the results to determine if the test input is invalid/improper (e.g., could not occur in actual operation) or if some correction of the device and/or its programming is necessary (e.g., a vulnerability, bug, flaw, etc. in the device is discovered by the testing).

In some examples, the testing computing device 518 includes means for analyzing results. For example, the means for analyzing results may be implemented by the results analyzer circuitry 610. In some examples, the results analyzer circuitry 610 may be implemented by machine executable instructions such as that implemented by at least blocks 806-810, 818, 822-828, and 836 of FIG. 8 executed by processor circuitry, which may be implemented by the example processor circuitry 1512 of FIG. 15, the example processor circuitry 1600 of FIG. 16, and/or the example Field Programmable Gate Array (FPGA) circuitry 1700 of FIG. 17. In other examples, the results analyzer circuitry 610 is implemented by other hardware logic circuitry, hardware implemented state machines, and/or any other combination of hardware, software, and/or firmware. For example, the results analyzer circuitry 610 may be implemented by at least one or more hardware circuits (e.g., processor circuitry, discrete and/or integrated analog and/or digital circuitry, an FPGA, an Application Specific Integrated Circuit (ASIC), a comparator, an operational-amplifier (op-amp), a logic circuit, etc.) structured to perform the corresponding operation without executing software or firmware, but other structures are likewise appropriate.

Figure 7:
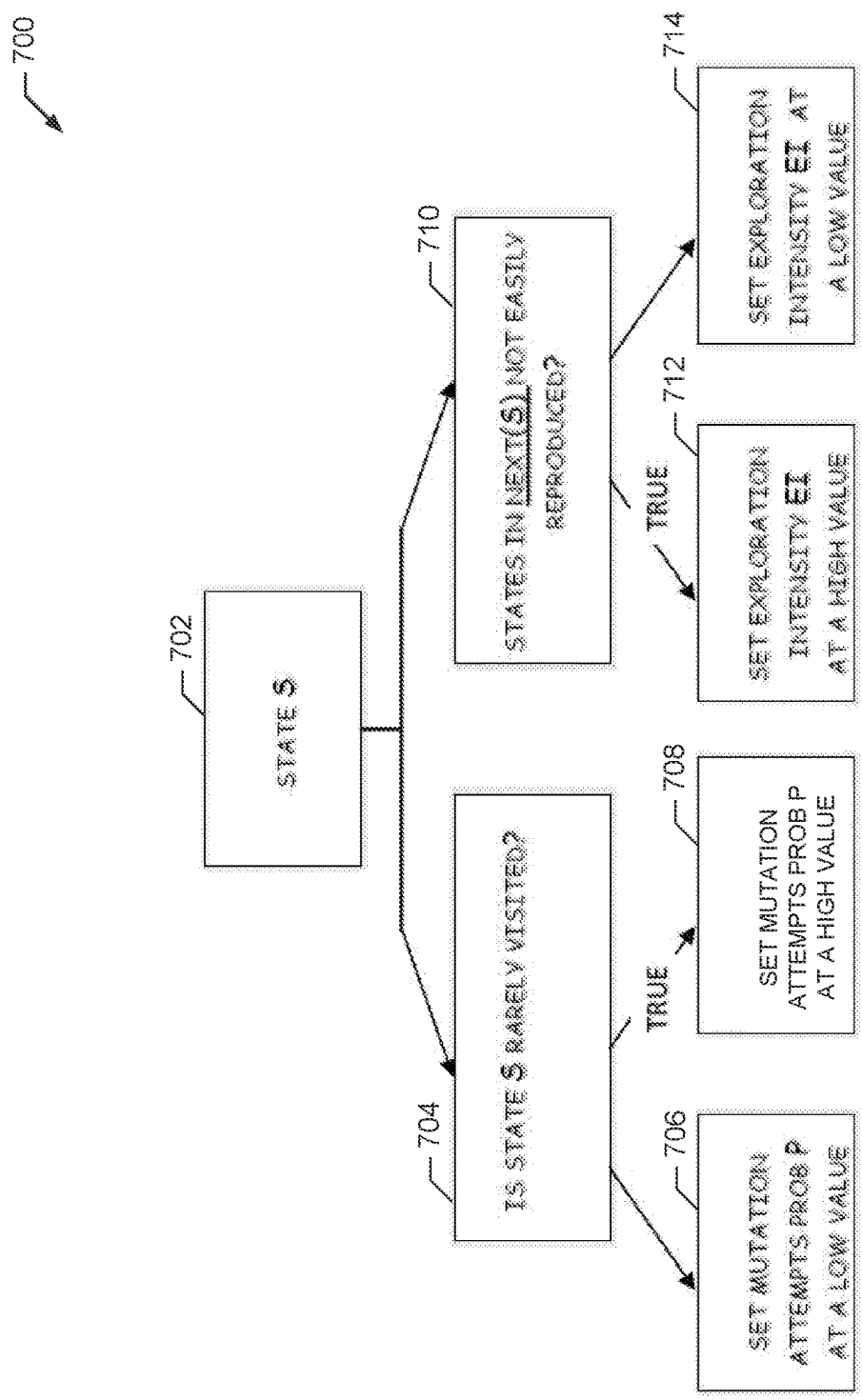
FIG. 7 illustrates a procedure for determining two settings: a mutation attempts probability P and an exploration intensity EI.

FIG. 7 illustrates a procedure for determining two settings: a mutation attempts probability P and an exploration intensity EI. Given a state S (block 702) that a system can be in, the two settings determine the amount of exploration that is performed by fuzzing testing inputs.

Network systems can be thought of at two levels of abstraction. First, at a higher level, there are software defined networks (SDNs). Automated software testing can be applied to testing of SDNs with the SDN control plane actions for configuring hosts, networking cards (NICs), switches, routers, etc. captured in the form of software.

At the next level of abstraction, there are the actual ingredient behaviors which are governed by how well the implementation of that ingredient (e.g., network interface card, switch, router, hub, firewall, etc.) conforms to a formal specification for that ingredient.

Systems and methods disclosed herein facilitate automated creation and augmentation of test inputs as newer software behaviors come to light, or as a way of continuously augmenting continuation integration/continuous delivery (CI/CD) test sets with a fuzz-test creation service; a service that receives input tests and test results from various ongoing test iterations in various network clusters. (These various systems may either be in pre-deployment functional validation and limited performance validation of just a small number of upgraded or updated components, or in post-deployment performance and stability evaluation of much large clusters in data center cloud, edge cloud, etc.)

Consider that the state S (block 702) may be a frequently reached (visited) state in the system, and states that can be reached after reaching state S (block 702) may be easily reproduced in normal testing (block 704); where, normal testing (as opposed to exhaustive testing) employs a frequently applied test set because the set represents common network behaviors. In this case, both of these settings (P, EI) are set low (block 706, block 714). This is because there is not much value in repeatedly reaching and exploring states that are easily reached by exercising a commonly available repertoire of inputs for testing.

On the other hand, if it is very difficult or rare to find the system in state S (block 702), then the number of different variations (mutations) of tests to be applied once the system is in state S (block 702) needs to be increased. This is achieved by choosing higher values for P (block 708). Similarly, for all applicable inputs in state S (block 702) for exploring states reachable from state S (block 702), if there are states that are hard to reproduce, then more expensive (costly to perform) mutations of inputs are desirable or admissible and, thus, EI is raised to a higher value (block 712).

For states with high mutation attempts probability P (block 708) and/or high exploration intensity (block 712), the policy handler circuitry 604 provisions more resources (memory, CPUs, time) etc. so that more variations of input tests can be produced and exercised once a system can be reliably driven into state S (block 702). Similarly, a large number of inputs leading up to more frequently reached states (those with low P (block 706)) may be pruned from test sets over time in order to maximize coverage density and testing speeds.

Rarely reached states with high out-degrees (e.g., many outgoing edges/paths) are similarly assigned higher volumes in resources, so that the likelihood of exercising code paths is increased for infrequently traversed code. This translates to covering more intense testing of networks with more input mutations and more probe attempts by increasing the number of mutated variables and numbers of mutations of variables; and can be driven by concolic execution where applicable.

Considering a network system that includes programmable devices, the programming protocol can be utilized as a bridge. P4 is an open source programming language that lets programmers dictate how processor chips in network forwarding devices such as switches, routers and network interface cards work. This lets the programmers customize each layer of the infrastructure stack—and not be limited by a device's hardware, firmware, or embedded software. For a device that is not directly programmable by P4, it is assumed that there exists tools that compute the right configuration or settings and right firmware or other options programming so that the device's actual behavior in theory resembles that of a device directly programmed by P4.

For testing in such an environment, the software system that is typically analyzed and whose states are being calibrated and whose discrepancies are identified and catalogued is replaced by the Physical implementation of that software system (e.g., the network device) that is the subject of those state calibrations, test input augmentations, etc. Thus, systems and methods disclosed herein effectively walking through the code coverage of the P4 program code coverage on the Physical Implementation of that program instead of the software implementation that programs the networking element.

While an example manner of implementing the testing computing device 518 is illustrated in FIG. 6, one or more of the elements, processes, and/or devices illustrated in FIG. 6 may be combined, divided, rearranged, omitted, eliminated, and/or implemented in any other way. Further, the example policy handler circuitry 604, the example mutations generator circuitry 608, the example input selector circuitry 606, the example results analyzer 610, and/or, more generally, the example testing computing device 518 of FIG. 5, may be implemented by hardware, software, firmware, and/or any combination of hardware, software, and/or firmware. Thus, for example, any of the example policy handler circuitry 604, the example mutations generator circuitry 608, the example input selector circuitry 606, the example results analyzer 610, and/or, more generally, the example testing computing device 518 of FIG. 5, could be implemented by processor circuitry, analog circuit(s), digital circuit(s), logic circuit(s), programmable processor(s), programmable microcontroller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)) such as Field Programmable Gate Arrays (FPGAs). When reading any of the apparatus or system claims of this patent to cover a purely software and/or firmware implementation, at least one of the example policy handler circuitry 604, the example mutations generator circuitry 608, the example input selector circuitry 606, the example results analyzer 610, and/or, more generally, the example testing computing device 518 of FIG. 5 is/are hereby expressly defined to include a non-transitory computer readable storage device or storage disk such as a memory, a digital versatile disk (DVD), a compact disk (CD), a Blu-ray disk, etc., including the software and/or firmware. Further still, the example testing computing device 518 may include one or more elements, processes, and/or devices in addition to, or instead of, those illustrated in FIG. 6, and/or may include more than one of any or all of the illustrated elements, processes and devices.

Flowcharts representative of example hardware logic circuitry, machine readable instructions, hardware implemented state machines, and/or any combination thereof for implementing the testing computing device 518 are shown in FIGS. 8-14. The machine readable instructions may be one or more executable programs or portion(s) of an executable program for execution by processor circuitry, such as the processor circuitry 1512 shown in the example processor platform 1500 discussed below in connection with FIG. 15 and/or the example processor circuitry discussed below in connection with FIGS. 16 and/or 17. The program may be embodied in software stored on one or more non-transitory computer readable storage media such as a CD, a floppy disk, a hard disk drive (HDD), a DVD, a Blu-ray disk, a volatile memory (e.g., Random Access Memory (RAM) of any type, etc.), or a non-volatile memory (e.g., FLASH memory, an HDD, etc.) associated with processor circuitry located in one or more hardware devices, but the entire program and/or parts thereof could alternatively be executed by one or more hardware devices other than the processor circuitry and/or embodied in firmware or dedicated hardware. The machine readable instructions may be distributed across multiple hardware devices and/or executed by two or more hardware devices (e.g., a server and a client hardware device). For example, the client hardware device may be implemented by an endpoint client hardware device (e.g., a hardware device associated with a user) or an intermediate client hardware device (e.g., a radio access network (RAN) gateway that may facilitate communication between a server and an endpoint client hardware device). Similarly, the non-transitory computer readable storage media may include one or more mediums located in one or more hardware devices. Further, although the example program is described with reference to the flowchart illustrated in FIGS. 8-14, many other methods of implementing the example testing computing device 518 may alternatively be used. For example, the order of execution of the blocks may be changed, and/or some of the blocks described may be changed, eliminated, or combined. Additionally or alternatively, any or all of the blocks may be implemented by one or more hardware circuits (e.g., processor circuitry, discrete and/or integrated analog and/or digital circuitry, an FPGA, an ASIC, a comparator, an operational-amplifier (op-amp), a logic circuit, etc.) structured to perform the corresponding operation without executing software or firmware. The processor circuitry may be distributed in different network locations and/or local to one or more hardware devices (e.g., a single-core processor (e.g., a single core central processor unit (CPU)), a multi-core processor (e.g., a multi-core CPU), etc.) in a single machine, multiple processors distributed across multiple servers of a server rack, multiple processors distributed across one or more server racks, a CPU and/or a FPGA located in the same package (e.g., the same integrated circuit (IC) package or in two or more separate housings, etc).

The machine readable instructions described herein may be stored in one or more of a compressed format, an encrypted format, a fragmented format, a compiled format, an executable format, a packaged format, etc. Machine readable instructions as described herein may be stored as data or a data structure (e.g., as portions of instructions, code, representations of code, etc.) that may be utilized to create, manufacture, and/or produce machine executable instructions. For example, the machine readable instructions may be fragmented and stored on one or more storage devices and/or computing devices (e.g., servers) located at the same or different locations of a network or collection of networks (e.g., in the cloud, in edge devices, etc.). The machine readable instructions may require one or more of installation, modification, adaptation, updating, combining, supplementing, configuring, decryption, decompression, unpacking, distribution, reassignment, compilation, etc., in order to make them directly readable, interpretable, and/or executable by a computing device and/or other machine. For example, the machine readable instructions may be stored in multiple parts, which are individually compressed, encrypted, and/or stored on separate computing devices, wherein the parts when decrypted, decompressed, and/or combined form a set of machine executable instructions that implement one or more operations that may together form a program such as that described herein.

In another example, the machine readable instructions may be stored in a state in which they may be read by processor circuitry, but require addition of a library (e.g., a dynamic link library (DLL)), a software development kit (SDK), an application programming interface (API), etc., in order to execute the machine readable instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, machine readable media, as used herein, may include machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example operations of FIGS. 8-14 may be implemented using executable instructions (e.g., computer and/or machine readable instructions) stored on one or more non-transitory computer and/or machine readable media such as optical storage devices, magnetic storage devices, an HDD, a flash memory, a read-only memory (ROM), a CD, a DVD, a cache, a RAM of any type, a register, and/or any other storage device or storage disk in which information is stored for any duration (e.g., for extended time periods, permanently, for brief instances, for temporarily buffering, and/or for caching of the information). As used herein, the terms non-transitory computer readable medium and non-transitory computer readable storage medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Figure 8:
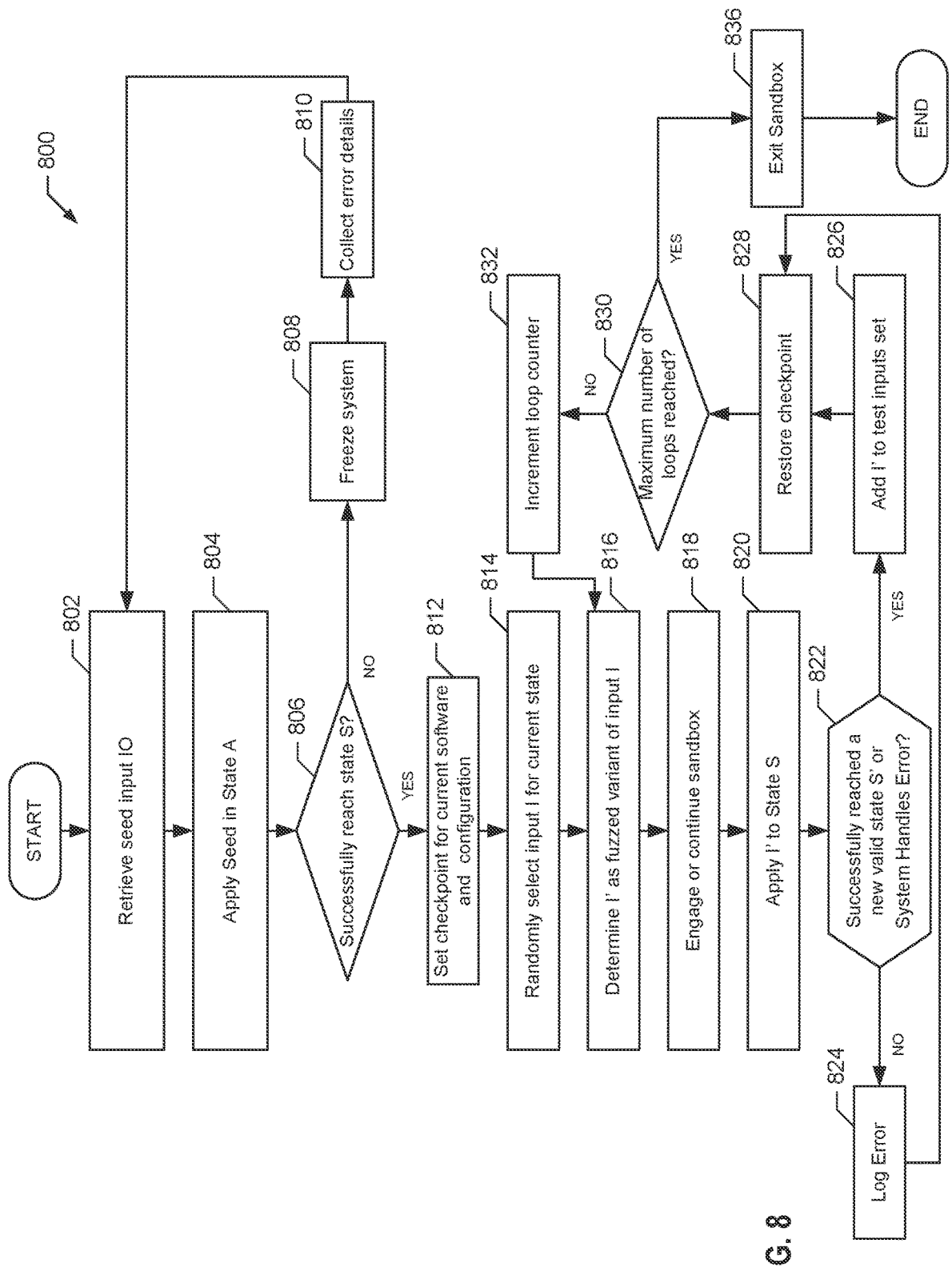
FIGS. 8-14 are flowcharts representative of example machine readable instructions and/or example operations that may be executed and/or instantiated by processor circuitry to test a computing system component.

The process 800 of FIG. 8 begins when the input selector circuitry 606 retrieves seed input I0 from the example test coverage matrix 602 (block 802). For example, the seed input I0 may be an input already available from classic test inputs or classic test inputs augmented with additional valid tests discovered by previous applications of fuzzing. The input selector circuitry 606 applies the seed input I0 to a system (e.g., the programmable device 514) (block 804). For example, the seed input I0 may be expected to transition the system to a state S based on knowledge from a specification or from previous testing.

The example results analyzer circuitry 610 determines if the system successfully reached state S (block 806). When the system does not successfully transition to state S (e.g., encounters some error or anomaly), the results analyzer circuitry 610 freezes the system (block 808) and collects error details (block 810). For example, the error details may be analyzed by a human to determine whether the seed input test needs to be revalidated as a valid seed input. Control returns to block 802 to begin a new incarnation of the testing process. The choice of the next incarnation may vary according to a policy. For example, one policy may specify to wait until the system is released from block 810 by a human expert after they have debugged and/or fixed the problem that caused the failure to reach State S in block 806. Another example policy may specify to wait at block 810 for a period of time and, if no human expert intervenes, to reset the system and then select another alternative input I0, to get the system to State S, or to pick some yet another alternative input I0 to get into a different valid state. In other words, the policy may cause the testing process to keep trying to fix an identified problem, or try doing more tests without indefinitely waiting for a human expert to show up and debug a current identified problem).

Alternatively, if the system successfully proceeds to state S (block 806), the results analyzer circuitry 610 checkpoints the system configuration (e.g., all of the software state variables and device operating configuration) (block 812). The input selector circuitry 606 then randomly selects an input I for the state S from the test coverage matrix 602 (block 814). The mutations generator circuitry 608 determines I' as a fuzzed variant of the input I (block 816). For example, any techniques to generate mutations over seed inputs may be utilized (e.g., genetic methods, simulated annealing, generative adversarial network (GAN), recurrent deep learning, etc.). The amount of exploration (P) and the degree of mutation (EI) may be determined by the policy handler circuitry 604 in accordance with the process illustrated in FIG. 7 and such parameters are passed to the mutations generator circuitry 608 for use in generating I'.

The system is then placed in a sandbox if it is not already in a sandbox (block 818). The input selector circuitry 606 then applies I' to the system in state S (block 820). The results analyzer circuitry 610 determines if the system successfully reached a new valid State S' or the system handled any errors (block 822). If the system did not reach State S' or gracefully handle errors (e.g., the system hangs, or crashes), the results analyzer circuitry 610 logs the error (block 824) for later analysis and control proceeds to block

828. For example, the logged error may be analyzed to determine whether the system needs to be debugged and fixed or whether the test input I' that produced the error is an invalid input (e.g., it cannot arise in real world).

If the system reached S' or handled any errors (block 822), the results analyzer circuitry 610 adds the fuzzed input I' is added the test input set for use in later testing (block 826). For example, if I' generated an error or fault that the system handles correctly or the system rejects the test input I', then the new input I' may be added as a valid test for testing resilience to problematic inputs.

After logging an error (block 824) or adding I' to the test set (block 826), the results analyzer circuitry 610 causes the system to be restored from the checkpoint set in block 812 (block 828). Alternatively, if the current state S' is a valid state reached from I', the system could proceed from State S' without restoring from the checkpoint.

The policy handler circuitry 604 then determines if a maximum number of loops has been reached (block 830). If the maximum number of loops/iterations has not been reached (for example the maximum number may be set by an administrative policy), the policy handler circuitry 604 increments a loop counter (block 832) and control proceeds to block 816 to continue mutations. When the maximum number of iterations has been reached, the system is restored from the checkpoint set at block 812 (block 834). According to the illustrated example, the results analyzer circuitry 610 causes the system to exit the sandbox (block 836) and the process ends. Alternatively, control may return to block 814 to select a new input I for testing.

The process 800 of FIG. 8 may be repeated for other states for which the out paths remain very lightly tested or not tested at all to create a rich test matrix.

Figure 9:
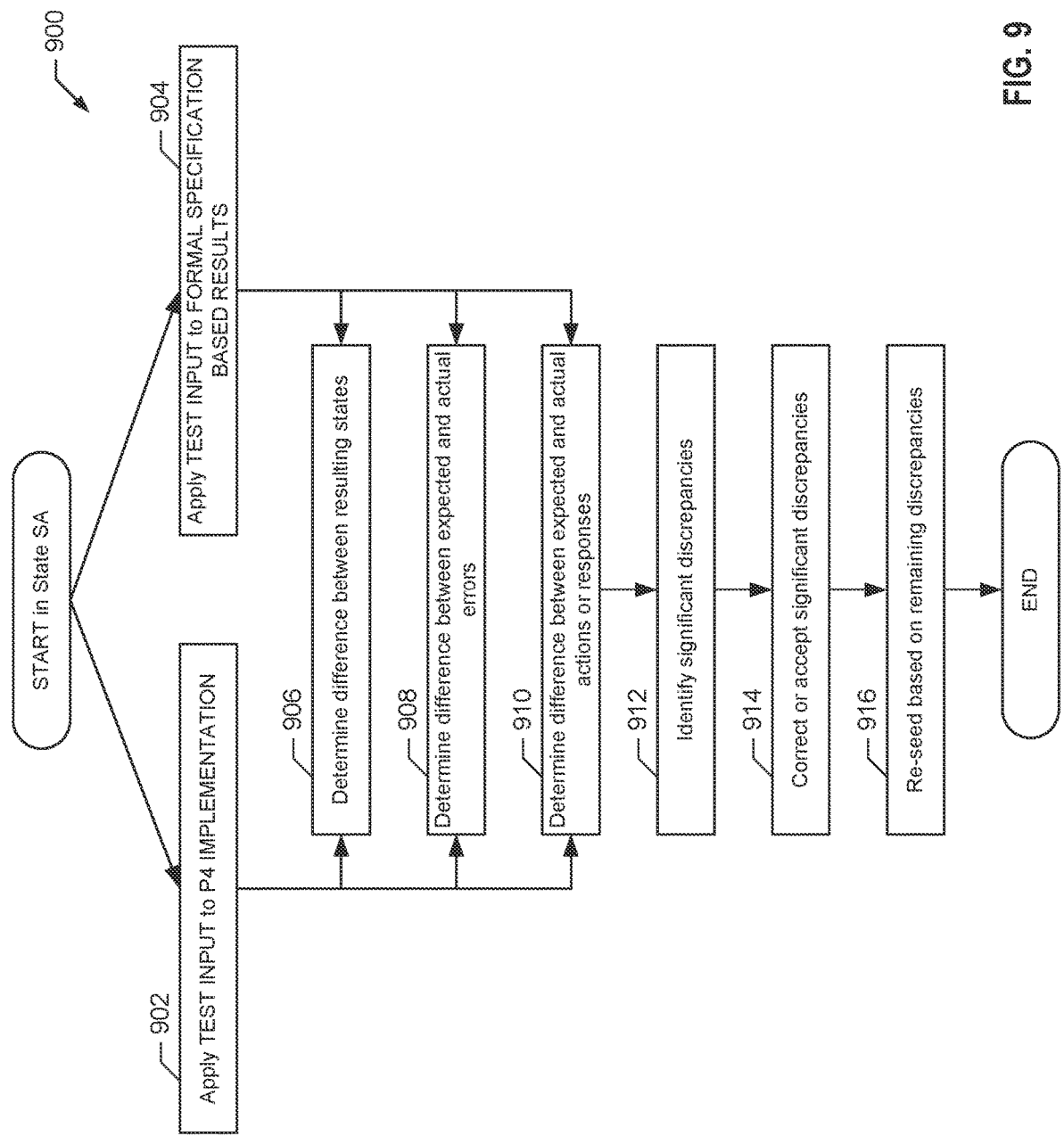

The rich test matrix created by the process of FIG. 8 may be employed during protocol and device implementation testing as described in FIG. 9.

The process of FIG. 9 is driven by a formal specification or model for a component under test. The formal specification may be specified in a machine interpretable way, so that given a starting state ("SA") and any test input ("I"), the correct next state ("SB") can be derived mechanically by following a decision tree (a set of rules or evaluations), a mapping, a simulation, etc. Given a practical implementation of the same formal model in the form of some software program Ω that executes on hardware, the same input may take the implementation (e.g., program Ω) to some state (SB'). Similarly, while the formal specification may say that the given input when provided to the formal model, should emit a response or an action ("R") and/or an error ("E"), the actual implementation of the formal specification may produce a response or an action ("R'") and/or an error ("E'"); where an error "E" may include an indication that the formal model does not have a defined behavior (because of a gap in the formal specification).

The process of FIG. 9 begins with the component in a starting state SA. The example input selector circuitry 606 applies a test input to the component (e.g., a P4 implementation of a network component) (block 902). The input selector circuitry 606 applies the same test input to a formal specification to determine the expected result (block 904). The results analyzer circuitry 610 then determines a difference between the state resulting from the test inputs applied to the P4 implementation and the expected state from the formal specification based results (block 906). The results analyzer circuitry 610 then determines a difference between the errors resulting from the test inputs applied to the P4 implementation and the expected errors from the formal specification based results (block 908). The results analyzer circuitry 610 then determines a difference between the actions or responses resulting from the test inputs applied to the P4 implementation and the expected actions or responses from the formal specification based results (block 910).

The results analyzer circuitry 610 then identifies significant discrepancies (block 912). The gap or distance between (SB, E, and R) on the one hand, and (SB', E', and R') on the other, is evaluated by some metric such as cosine similarity for numerical variables or a similarity measure over categorical variables. For example, a discrepancy may be significant when the distance metric meets a threshold.

The example results analyzer circuitry 610 then corrects or accepts significant discrepancies (block 914). The testing and evaluation of discrepancies is used as a feedback mechanism. Those discrepancies that are significant are either corrected (in this case, recorded as needing correction to be performed either on the formal spec side, or on the implementation side), or they are not correctable (e.g., implementation is accepted as being justifiably different) and the test input matrix is annotated accordingly.

According to the illustrated example, discrepancies that remain (e.g., neither the formal specification nor the implementation is altered), lead to reseeding the set of input tests (block 916) so that the likelihood of tests that produce the known discrepancies is reduced—for example, by marking various test inputs or mutations as nonproductive for further selection in further iterations of fuzzing.

Figure 10:
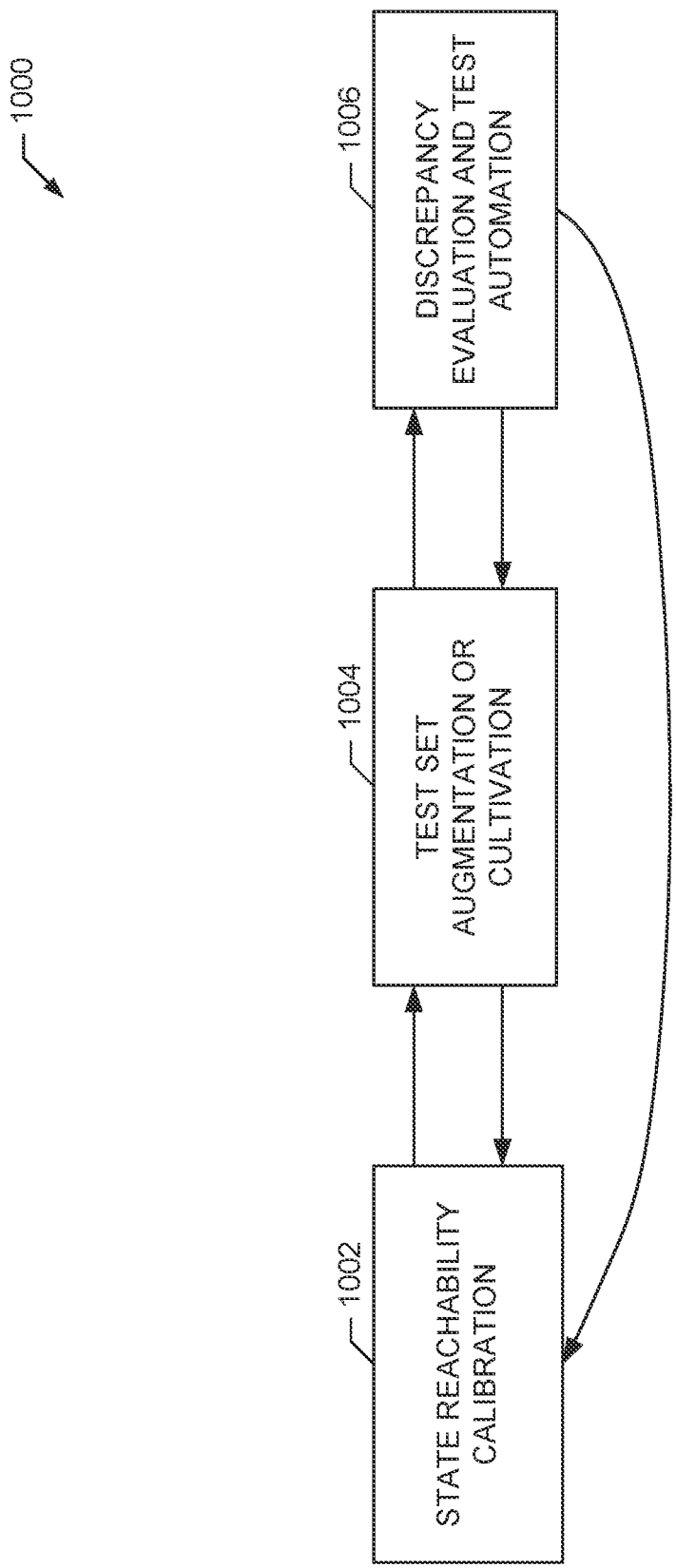

FIG. 10 illustrates a circular nature of flow between the phases of analysis: state reachability calibration (block 1002), test set augmentation or cultivation (block 1004), and discrepancy evaluation and test automation (block 1006).

According to the illustrated example of FIG. 10, a software system's implementation is measured (e.g., based on the process illustrated in FIG. 9) on a repository of test inputs against an artifact that permits evaluation, on the test inputs, of the expected behaviors and responses from a formal specification of the software system. The repository of tests comprises both a set of seed inputs and various mutated versions linked to those seed inputs. The seed inputs and the mutated versions of the seed inputs may be built by a procedure (e.g., as illustrated in FIG. 8) that maximizes the chances of producing rarer states and of following rare state transition paths. For example, the rarer states and state transitions may be identified on an iterative basis by repeatedly mutating ("fuzzing") the input tests in accordance with prior statistics on states that were not visited frequently or paths between states that were not commonly exercised by those tests. The setting of these probabilities and exploration intensities may be performed in accordance with the example illustrated in FIG. 7. FIG. 10 illustrates the circular nature of flow among the procedures of FIGS. 7, 8, and 9. The circular approach supports an evolving system that can provide for extensive testing of a system (e.g., evaluating inputs and states that might not be tested by prior systems).

It is common for applications to use shared memory transport when they are colocated on the same host. Instead of communicating using memory, the applications can be made to communicate over a network by creating a loopback communication in which the Rx and Tx portions of a network interface card in the host are programmed so that they communicate with one another.

Figure 11:
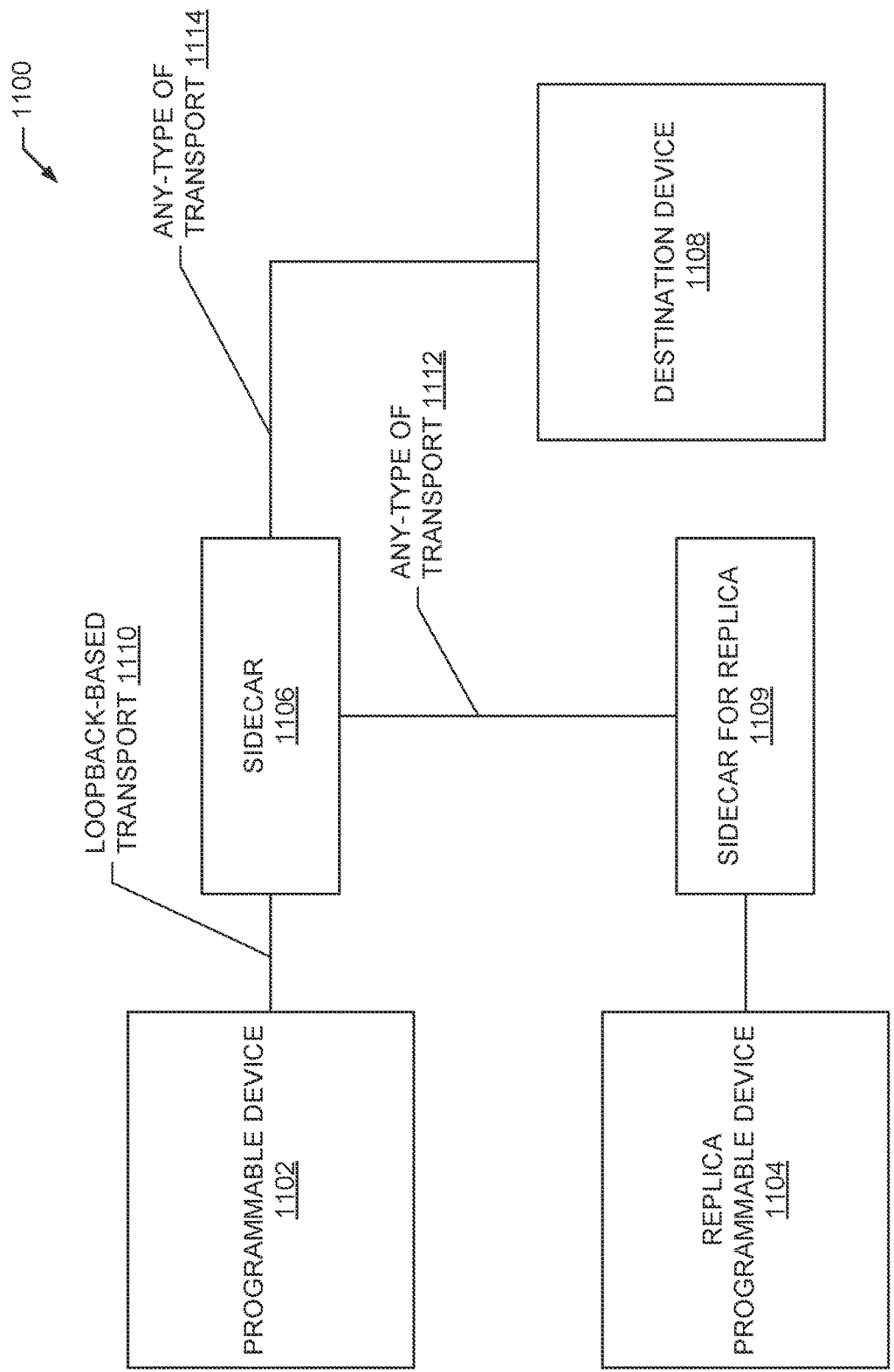

FIG. 11 illustrates a system 1100 to use loopback connections to test network behaviors. Consider that programmable device 1102 is being tested for robustness. The normal function of the programmable device 1102 is taken over by a replica programmable device 1104 as illustrated.

Communication from programmable device 1102 with any other device (e.g., destination device 1108) is through a sidecar 1106 (e.g., which is placed outside the sandbox) where that sidecar 1106 connects to the replication programmable device 1104 through a sidecar for replica 1109. From the standpoint of the destination device 1108, destination device 1108 is communicating with programmable device 1102, but sidecar 1106 relies on uninterrupted operation of replica programmable device 1104, so that the replica programmable device 1104 can, for all practical purposes masquerade as programmable device 1102. Since network behaviors of programmable device 1102 need to be tested properly, the link from programmable device 1102 to the sidecar 1106 is replaced from being a memory-based transport to a loopback-based transport 1110. The connections between the sidecar 1106 and the sidecar for replica 1109 may be any type of transport 1112 and the transport between sidecar 1106 and the destination device 1108 may be any type of transport 1114.

Figure 12:
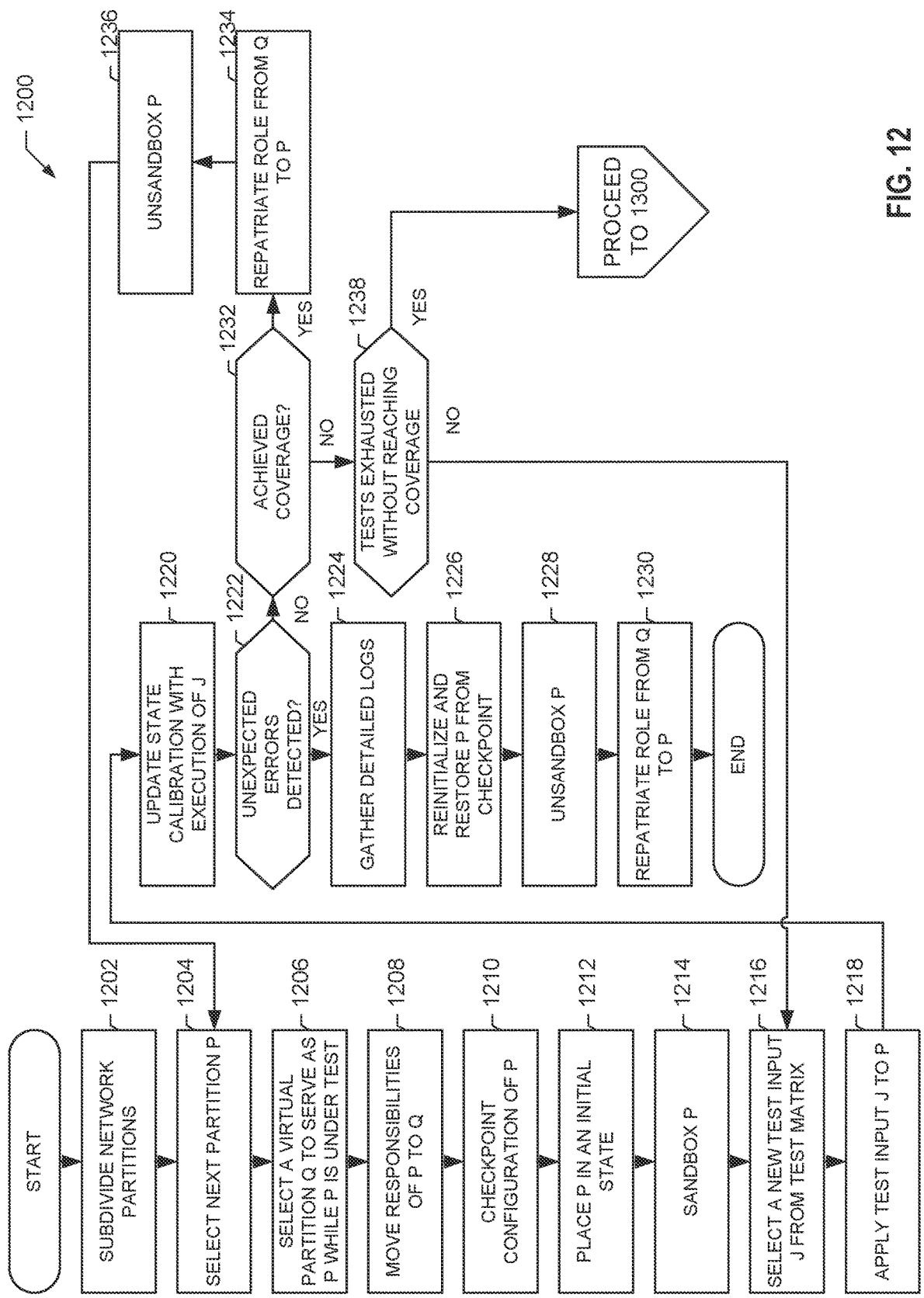
Figure 13:
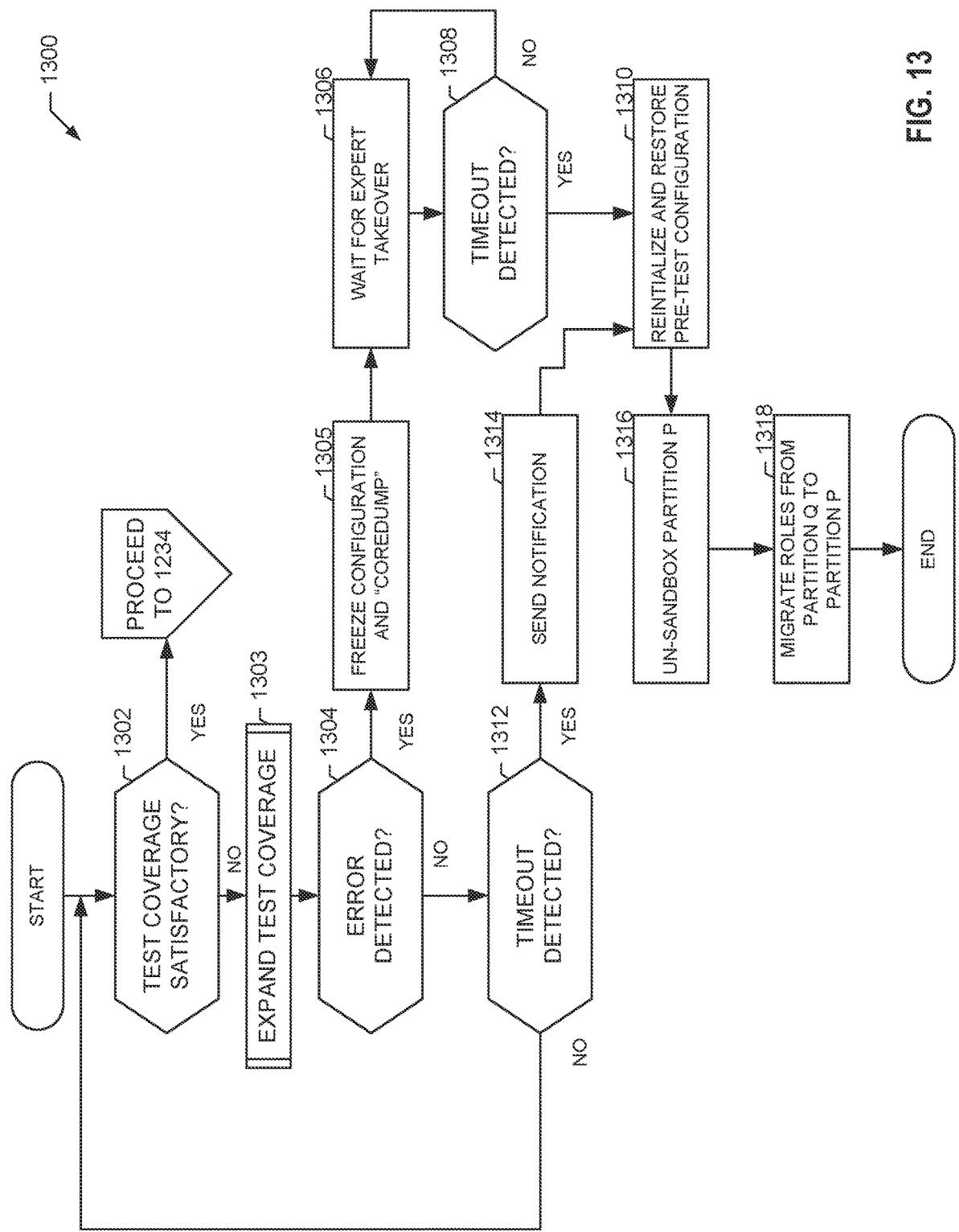
Figure 14:
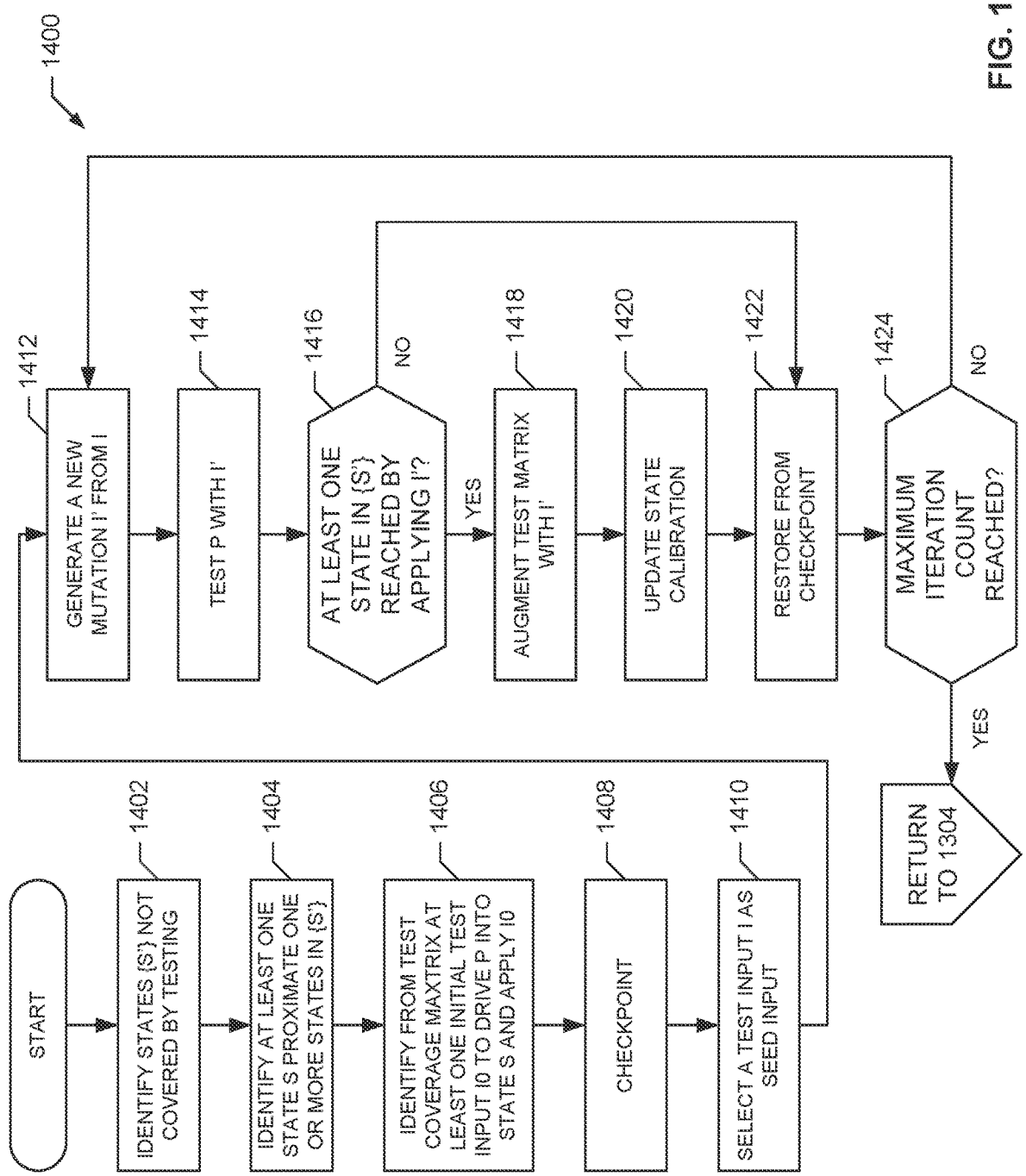

FIGS. 12-14 illustrate a process for integration testing. First, in FIG. 12, the existing test coverage matrix 602 is utilized (e.g., no fuzzing) and then testing expands as described in FIGS. 13 and 14 to widen coverage if determined to be appropriate. Testing is applied by partitioning network or system into manageable partitions, and testing each partition "P" separately in a sandbox, while giving P's role to some other physical or virtual partition Q.

The process 1200 of FIG. 12 begins when the input selector circuitry 606 subdivides the network into partitions (block 1202). The input selector circuitry 606 selects a first partition P (block 1204). The input selector circuitry 606 selects a virtual partition Q to serve as P while P is under testing (block 1206). The input selector circuitry 606 moves responsibilities of P to Q (block 1208). The input selector circuitry 606 checkpoints the configuration of P (block 1210). The input selector circuitry 606 places P in an initial state (block 1212) and sandboxes P (block 1214).

The input selector circuitry 606 selects a new test input J from the test matrix (block 1216). The input selector circuitry 606 applies the test input J to P (block 1218). The results analyzer circuitry 610 updates the state calibration with the execution of J (block 1220). The results analyzer circuitry 610 determines if any unexpected errors are detected (block 1222). When unexpected errors are detected, the results analyzer circuitry 610 gathers detailed logs (block 1224), reinitializes and restores P from the checkpoint (block 1226), unsandboxes P (block 1228), and repatriates roles from Q back to P (block 1230). In some examples, after gathering logs (block 1224), the results analyzer circuitry 610 may wait for an intervention by a user until a timeout expires before proceeding to block 1226.

When unexpected errors are not detected (block 1222), the results analyzer circuitry 610 determines if test coverage has been achieved (block 1232). The results analyzer circuitry 610 determines if tests have been exhausted without reaching coverage (block 1238). When tests have not been exhausted, control returns to block 1216 to continue testing. When tests have been exhausted without reaching coverage, control proceeds to process 1300 to develop additional test inputs.

Returning to block 1232, when coverage has been achieved, the results analyzer circuitry 610 repatriates rules from Q back to P (block 1234), unsandboxes P (block 1236), and control returns to block 1204 to select a next partition.

The process 1300 of FIG. 13 begins when the results analyzer circuitry 610 determines if test coverage is satisfactory (block 1302). When satisfactory coverage has been reached, control returns to block 1234. When satisfactory coverage has not been reached, the mutations generator circuitry 608 expands test coverage (block 1303). An example process for expanding test coverage is illustrated in FIG. 14.

The example results analyzer circuitry 610 determines if errors were detected during block 1303 (block 1304). When errors were detected, the results analyzer circuitry 610 freezes and the system configuration and triggers a "coredump" to collect data (block 1305). The results analyzer circuitry 610 waits for an expert to takeover (block 1306). When a timeout is detected while waiting (block 1308), the results analyzer circuitry 610 reinitializes and restores the pre-test configuration (block 1310) and control proceeds to block 1316.

Returning to block 1304, when no errors are detected, the results analyzer circuitry 610 determines if a timeout occurred during execution of block 1303. When a timeout has not occurred, control returns to block 1302 to continue looping. When a timeout has occurred, the results analyzer circuitry 610 sends a notification (block 1314). For example, a notification may be sent to an administrator. The results analyzer circuitry 610 reinitializes and restores the pre-test configuration (block 1310).

After the results analyzer circuitry 610 reinitializes and restores the pre-test configuration (block 1310), the results analyzer circuitry 610 unsandboxes partition P (block 1316) and migrates roles from partition Q back to partition P (block 1318).

The process 1400 of FIG. 14 begins when the policy handler circuitry 604 identifies states {S'} not covered by the testing (block 1402). The input selector circuitry 606 identifies at least one state S proximate one or more states in {S'} (block 1404). The input selector circuitry 606 identifies from the test coverage matrix 602 at least one initial test input I0 to drive P into state S and applies that test input I0 to move P into state S (block 1406). The results analyzer circuitry 610 checkpoints the system (block 1408). The input selector circuitry 606 selects a test input I as seed input (block 1410). The mutations generator circuitry 608 generates a new mutation I' from I (block 1412). The input selector circuitry 606 tests partition P using I' (block 1414).

The results analyzer circuitry 610 determines if at least one state in {S'} is reached by applying I' (block 1416). When no state in {S'} is reached by applying I', control proceeds to block 1422.

When at least one state in {S'} is reached by applying I', the results analyzer circuitry 610 augments the test matrix with I' (block 1418). The results analyzer circuitry 610 updates the state calibration based on the procedure in FIG. 7 (block 1420). The results analyzer circuitry 610 restores from the checkpoint set in block 1408 (block 1422). The results analyzer then determines if a maximum iteration count has been reached (block 1424). When a maximum iteration count has not been reached, control returns to block 1412 to continue looping. When the maximum iteration count has been reached, control returns to block 1304.

Figure 15:
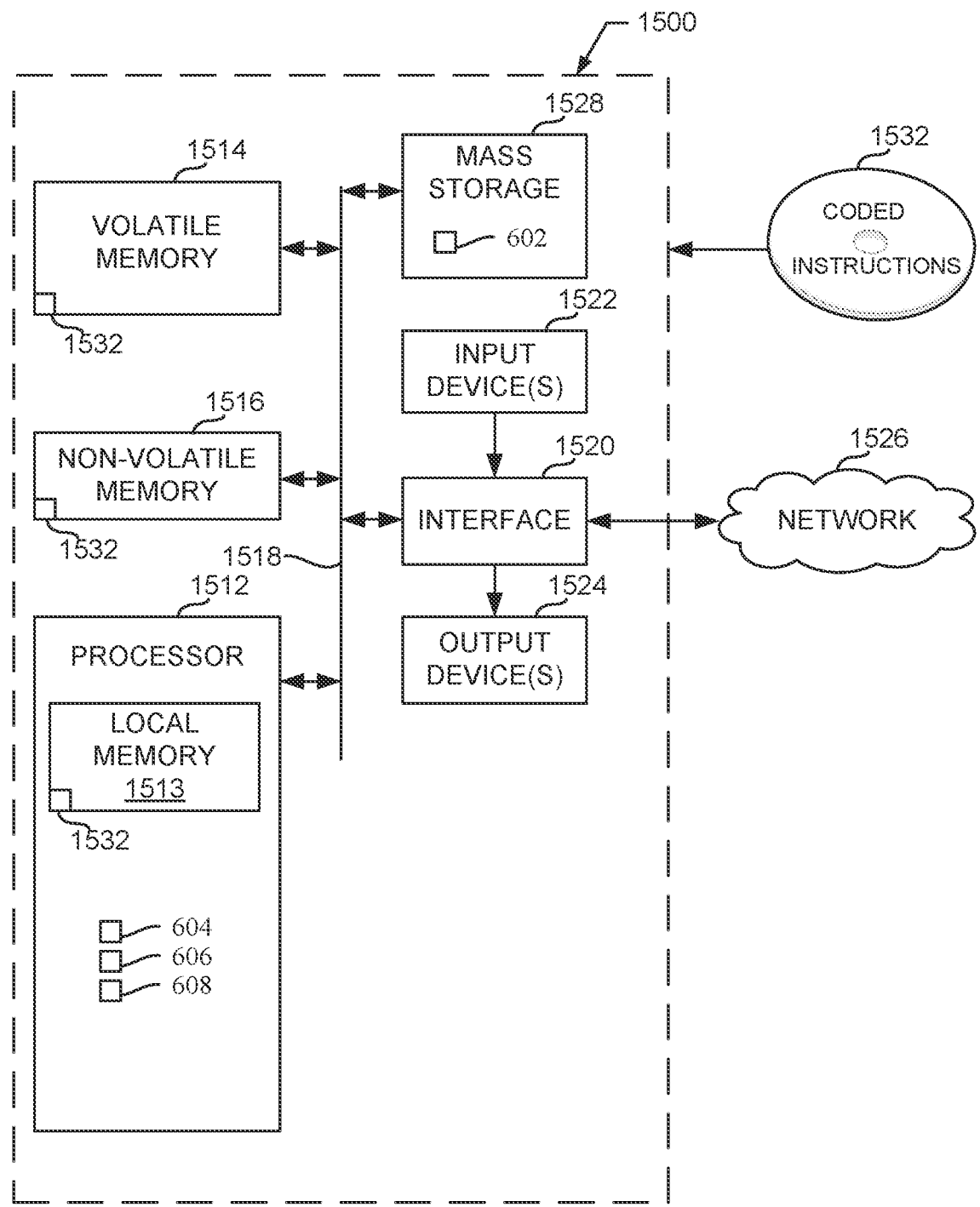
FIG. 15 is a block diagram of an example processing platform including processor circuitry structured to execute the example machine readable instructions of FIGS. 8-14 to implement the example testing computing device of FIG. 5.

FIG. 15 is a block diagram of an example processor platform 1500 structured to execute and/or instantiate some or all of the machine readable instructions and/or operations of FIGS. 8-14 to implement the testing computing device 518 of FIG. 5. The processor platform 1500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, or any other type of computing device.

The processor platform 1500 of the illustrated example includes processor circuitry 1512. The processor circuitry 1512 of the illustrated example is hardware. For example, the processor circuitry 1512 can be implemented by one or more integrated circuits, logic circuits, FPGAs microprocessors, CPUs, GPUs, DSPs, and/or microcontrollers from any desired family or manufacturer. The processor circuitry 1512 may be implemented by one or more semiconductor based (e.g., silicon based) devices. In this example, the processor circuitry 1512 implements the example policy handler circuitry 604, the example input selector circuitry 606, the example mutations generator circuitry 608, and the example results analyzer circuitry 610.

The processor circuitry 1512 of the illustrated example includes a local memory 1513 (e.g., a cache, registers, etc.). The processor circuitry 1512 of the illustrated example is in communication with a main memory including a volatile memory 1514 and a non-volatile memory 1516 by a bus 1518. The volatile memory 1514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 1516 may be implemented by flash memory and/or any other desired type of memory device. Access to the main memory 1514, 1516 of the illustrated example is controlled by a memory controller 1517.

The processor platform 1500 of the illustrated example also includes interface circuitry 1520. The interface circuitry 1520 may be implemented by hardware in accordance with any type of interface standard, such as an Ethernet interface, a universal serial bus (USB) interface, a Bluetooth® interface, a near field communication (NFC) interface, a PCI interface, and/or a PCIe interface.

In the illustrated example, one or more input devices 1522 are connected to the interface circuitry 1520. The input device(s) 1522 permit(s) a user to enter data and/or commands into the processor circuitry 1512. The input device(s) 1522 can be implemented by, for example, an audio sensor, a microphone, a camera (still or video), a keyboard, a button, a mouse, a touchscreen, a track-pad, a trackball, an isopoint device, and/or a voice recognition system.

One or more output devices 1524 are also connected to the interface circuitry 1520 of the illustrated example. The output devices 1524 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 1520 of the illustrated example, thus, typically includes a graphics driver card, a graphics driver chip, and/or graphics processor circuitry such as a GPU.

The interface circuitry 1520 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 1526. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 1500 of the illustrated example also includes one or more mass storage devices 1528 to store software and/or data. Examples of such mass storage devices 1528 include magnetic storage devices, optical storage devices, floppy disk drives, HDDs, CDs, Blu-ray disk drives, redundant array of independent disks (RAID) systems, solid state storage devices such as flash memory devices, and DVD drives. The example mass storage device 1528 includes the test coverage matrix 602.

The machine executable instructions 1532, which may be implemented by the machine readable instructions of FIG. 11, may be stored in the mass storage device 1528, in the volatile memory 1514, in the non-volatile memory 1516, and/or on a removable non-transitory computer readable storage medium such as a CD or DVD.

Figure 16:
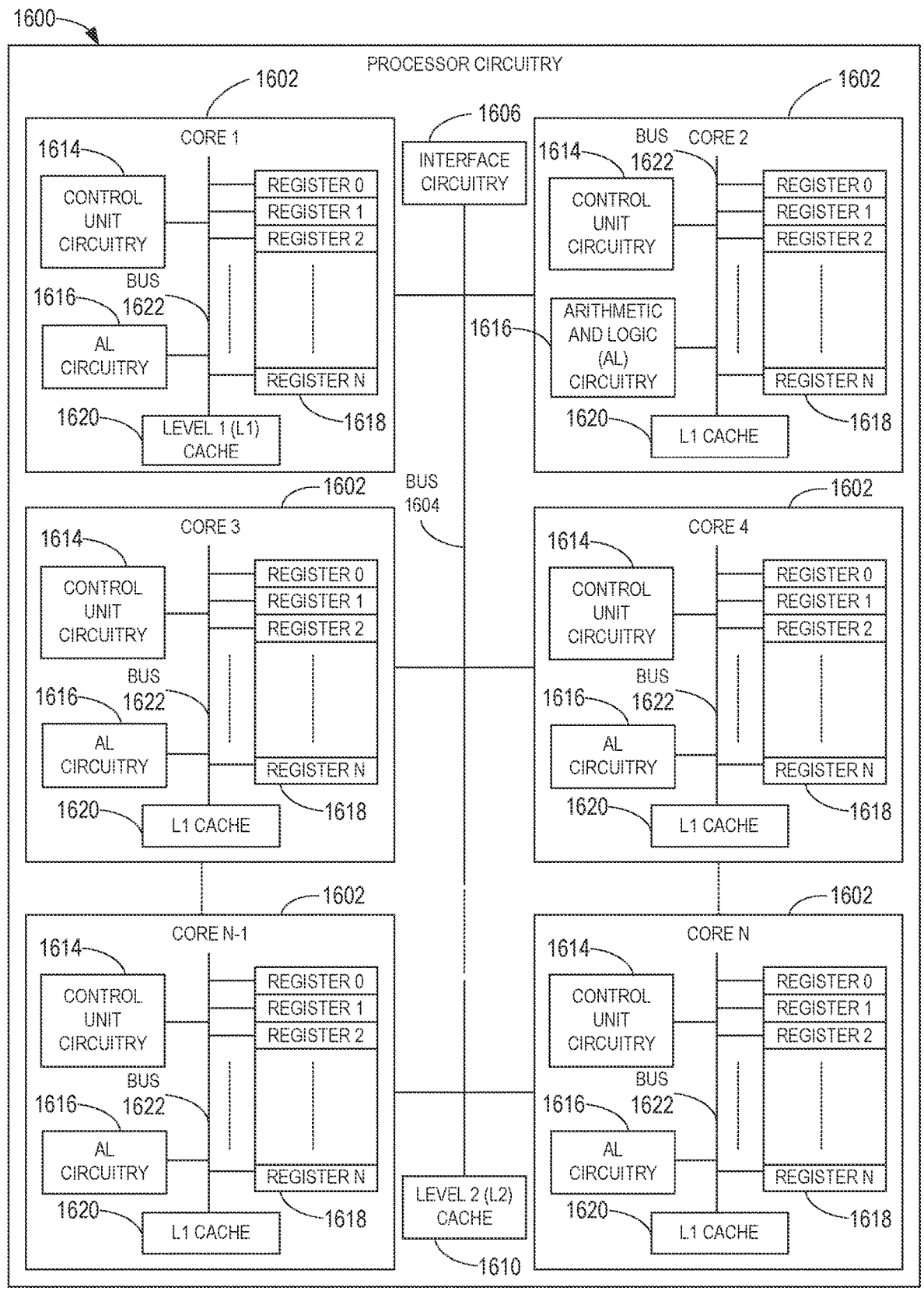
FIG. 16 is a block diagram of an example implementation of the processor circuitry of FIG. 15.

FIG. 16 is a block diagram of an example implementation of the processor circuitry 1512 of FIG. 15. In this example, the processor circuitry 1512 of FIG. 15 is implemented by a microprocessor 1600. For example, the microprocessor 1600 may implement multi-core hardware circuitry such as a CPU, a DSP, a GPU, an XPU, etc. Although it may include any number of example cores 1602 (e.g., 1 core), the microprocessor 1600 of this example is a multi-core semiconductor device including N cores. The cores 1602 of the microprocessor 1600 may operate independently or may cooperate to execute machine readable instructions. For example, machine code corresponding to a firmware program, an embedded software program, or a software program may be executed by one of the cores 1602 or may be executed by multiple ones of the cores 1602 at the same or different times. In some examples, the machine code corresponding to the firmware program, the embedded software program, or the software program is split into threads and executed in parallel by two or more of the cores 1602. The software program may correspond to a portion or all of the machine readable instructions and/or operations represented by the flowchart of FIG. 16.

The cores 1602 may communicate by an example bus 1604. In some examples, the bus 1604 may implement a communication bus to effectuate communication associated with one(s) of the cores 1602. For example, the bus 1604 may implement at least one of an Inter-Integrated Circuit (I2C) bus, a Serial Peripheral Interface (SPI) bus, a PCI bus, or a PCIe bus. Additionally or alternatively, the bus 1604 may implement any other type of computing or electrical bus. The cores 1602 may obtain data, instructions, and/or signals from one or more external devices by example interface circuitry 1606. The cores 1602 may output data, instructions, and/or signals to the one or more external devices by the interface circuitry 1606. Although the cores 1602 of this example include example local memory 1620 (e.g., Level 1 (L1) cache that may be split into an L1 data cache and an L1 instruction cache), the microprocessor 1600 also includes example shared memory 1610 that may be shared by the cores (e.g., Level 2 (L2_cache)) for high-speed access to data and/or instructions. Data and/or instructions may be transferred (e.g., shared) by writing to and/or reading from the shared memory 1610. The local memory 1620 of each of the cores 1602 and the shared memory 1610 may be part of a hierarchy of storage devices including multiple levels of cache memory and the main memory (e.g., the main memory 1514, 1516 of FIG. 15). Typically, higher levels of memory in the hierarchy exhibit lower access time and have smaller storage capacity than lower levels of memory. Changes in the various levels of the cache hierarchy are managed (e.g., coordinated) by a cache coherency policy.

Each core 1602 may be referred to as a CPU, DSP, GPU, etc., or any other type of hardware circuitry. Each core 1602 includes control unit circuitry 1614, arithmetic and logic (AL) circuitry (sometimes referred to as an ALU) 1616, a plurality of registers 1618, the L1 cache 1620, and an example bus 1622. Other structures may be present. For example, each core 1602 may include vector unit circuitry, single instruction multiple data (SIMD) unit circuitry, load/store unit (LSU) circuitry, branch/jump unit circuitry, floating-point unit (FPU) circuitry, etc. The control unit circuitry 1614 includes semiconductor-based circuits structured to control (e.g., coordinate) data movement within the corresponding core 1602. The AL circuitry 1616 includes semiconductor-based circuits structured to perform one or more mathematic and/or logic operations on the data within the corresponding core 1602. The AL circuitry 1616 of some examples performs integer based operations. In other examples, the AL circuitry 1616 also performs floating point operations. In yet other examples, the AL circuitry 1616 may include first AL circuitry that performs integer based operations and second AL circuitry that performs floating point operations. In some examples, the AL circuitry 1616 may be referred to as an Arithmetic Logic Unit (ALU). The registers 1618 are semiconductor-based structures to store data and/or instructions such as results of one or more of the operations performed by the AL circuitry 1616 of the corresponding core 1602. For example, the registers 1618 may include vector register(s), SIMD register(s), general purpose register(s), flag register(s), segment register(s), machine specific register(s), instruction pointer register(s), control register(s), debug register(s), memory management register(s), machine check register(s), etc. The registers 1618 may be arranged in a bank as shown in FIG. 16. Alternatively, the registers 1618 may be organized in any other arrangement, format, or structure including distributed throughout the core 1602 to shorten access time. The bus 1620 may implement at least one of an I2C bus, a SPI bus, a PCI bus, or a PCIe bus Each core 1602 and/or, more generally, the microprocessor 1600 may include additional and/or alternate structures to those shown and described above. For example, one or more clock circuits, one or more power supplies, one or more power gates, one or more cache home agents (CHAs), one or more converged/common mesh stops (CMSs), one or more shifters (e.g., barrel shifter(s)) and/or other circuitry may be present. The microprocessor 1600 is a semiconductor device fabricated to include many transistors interconnected to implement the structures described above in one or more integrated circuits (ICs) contained in one or more packages. The processor circuitry may include and/or cooperate with one or more accelerators. In some examples, accelerators are implemented by logic circuitry to perform certain tasks more quickly and/or efficiently than can be done by a general purpose processor. Examples of accelerators include ASICs and FPGAs such as those discussed herein. A GPU or other programmable device can also be an accelerator. Accelerators may be on-board the processor circuitry, in the same chip package as the processor circuitry and/or in one or more separate packages from the processor circuitry.

Figure 17:
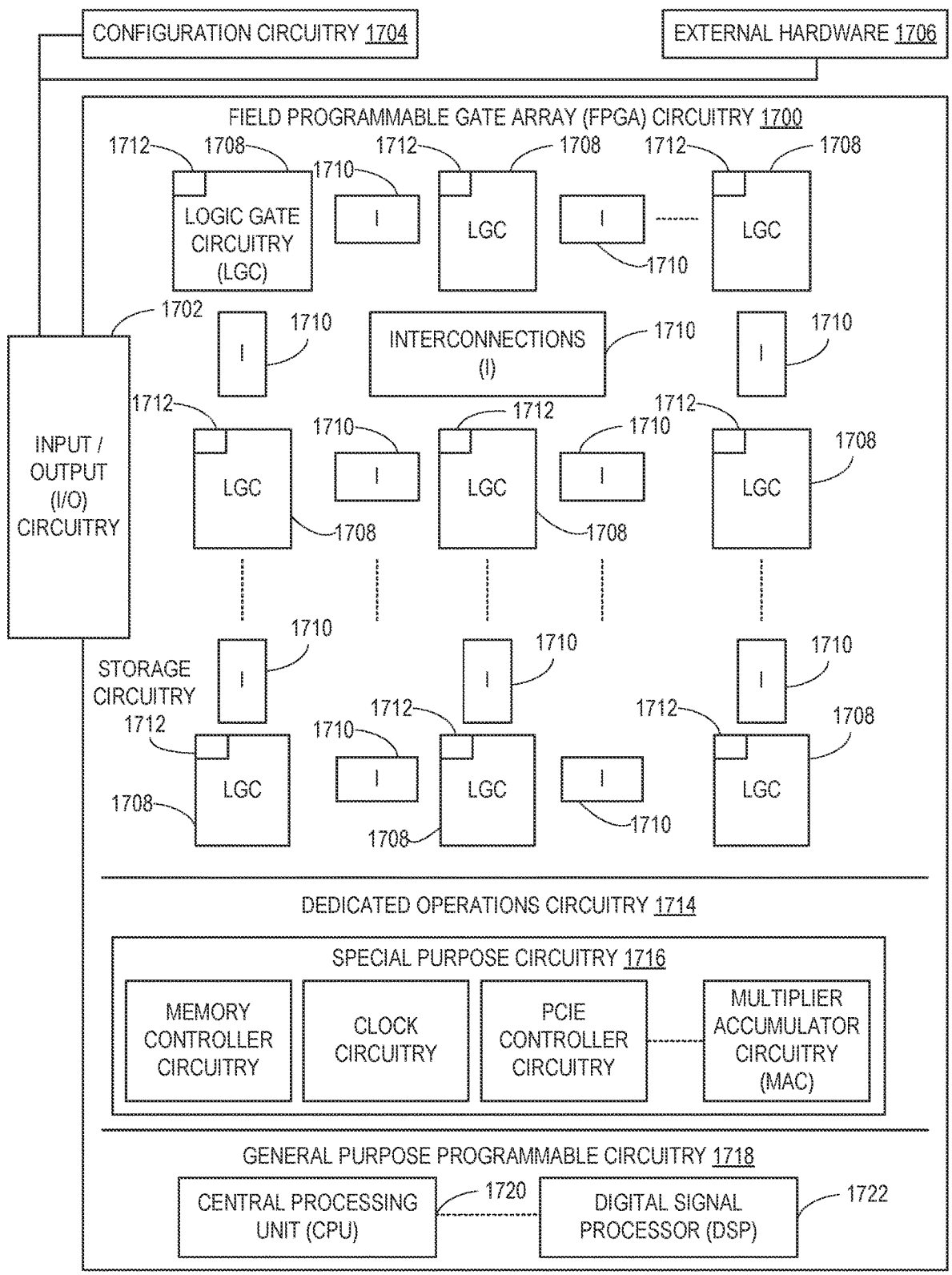
FIG. 17 is a block diagram of another example implementation of the processor circuitry of FIG. 15.

FIG. 17 is a block diagram of another example implementation of the processor circuitry 1512 of FIG. 15. In this example, the processor circuitry 1512 is implemented by FPGA circuitry 1700. The FPGA circuitry 1700 can be used, for example, to perform operations that could otherwise be performed by the example microprocessor 1500 of FIG. 15 executing corresponding machine readable instructions. However, once configured, the FPGA circuitry 1700 instantiates the machine readable instructions in hardware and, thus, can often execute the operations faster than they could be performed by a general purpose microprocessor executing the corresponding software.

More specifically, in contrast to the microprocessor 1600 of FIG. 16 described above (which is a general purpose device that may be programmed to execute some or all of the machine readable instructions represented by the flowchart of FIGS. 8-14 but whose interconnections and logic circuitry are fixed once fabricated), the FPGA circuitry 1700 of the example of FIG. 17 includes interconnections and logic circuitry that may be configured and/or interconnected in different ways after fabrication to instantiate, for example, some or all of the machine readable instructions represented by the flowchart of FIGS. 8-14. In particular, the FPGA 1700 may be thought of as an array of logic gates, interconnections, and switches. The switches can be programmed to change how the logic gates are interconnected by the interconnections, effectively forming one or more dedicated logic circuits (unless and until the FPGA circuitry 1700 is reprogrammed). The configured logic circuits enable the logic gates to cooperate in different ways to perform different operations on data received by input circuitry. Those operations may correspond to some or all of the software represented by the flowchart of FIGS. 8-14. As such, the FPGA circuitry 1700 may be structured to effectively instantiate some or all of the machine readable instructions of the flowchart of FIGS. 8-14 as dedicated logic circuits to perform the operations corresponding to those software instructions in a dedicated manner analogous to an ASIC. Therefore, the FPGA circuitry 1700 may perform the operations corresponding to the some or all of the machine readable instructions of FIGS. 8-14 faster than the general purpose microprocessor can execute the same.

In the example of FIG. 17, the FPGA circuitry 1700 is structured to be programmed (and/or reprogrammed one or more times) by an end user by a hardware description language (HDL) such as Verilog. The FPGA circuitry 1700 of FIG. 17, includes example input/output (I/O) circuitry 1702 to obtain and/or output data to/from example configuration circuitry 1704 and/or external hardware (e.g., external hardware circuitry) 1706. For example, the configuration circuitry 1704 may implement interface circuitry that may obtain machine readable instructions to configure the FPGA circuitry 1700, or portion(s) thereof. In some such examples, the configuration circuitry 1704 may obtain the machine readable instructions from a user, a machine (e.g., hardware circuitry (e.g., programmed or dedicated circuitry) that may implement an Artificial Intelligence/Machine Learning (AI/ML) model to generate the instructions), etc. In some examples, the external hardware 1706 may implement the microprocessor 1600 of FIG. 16. The FPGA circuitry 1700 also includes an array of example logic gate circuitry 1708, a plurality of example configurable interconnections 1710, and example storage circuitry 1712. The logic gate circuitry 1708 and interconnections 1710 are configurable to instantiate one or more operations that may correspond to at least some of the machine readable instructions of FIGS. 8-14 and/or other desired operations. The logic gate circuitry 1708 shown in FIG. 17 is fabricated in groups or blocks. Each block includes semiconductor-based electrical structures that may be configured into logic circuits. In some examples, the electrical structures include logic gates (e.g., And gates, Or gates, Nor gates, etc.) that provide basic building blocks for logic circuits. Electrically controllable switches (e.g., transistors) are present within each of the logic gate circuitry 1708 to enable configuration of the electrical structures and/or the logic gates to form circuits to perform desired operations. The logic gate circuitry 1708 may include other electrical structures such as look-up tables (LUTs), registers (e.g., flip-flops or latches), multiplexers, etc.

The interconnections 1710 of the illustrated example are conductive pathways, traces, vias, or the like that may include electrically controllable switches (e.g., transistors) whose state can be changed by programming (e.g., using an HDL instruction language) to activate or deactivate one or more connections between one or more of the logic gate circuitry 1708 to program desired logic circuits.

The storage circuitry 1712 of the illustrated example is structured to store result(s) of the one or more of the operations performed by corresponding logic gates. The storage circuitry 1712 may be implemented by registers or the like. In the illustrated example, the storage circuitry 1712 is distributed amongst the logic gate circuitry 1708 to facilitate access and increase execution speed.

The example FPGA circuitry 1700 of FIG. 17 also includes example Dedicated Operations Circuitry 1714. In this example, the Dedicated Operations Circuitry 1714 includes special purpose circuitry 1716 that may be invoked to implement commonly used functions to avoid the need to program those functions in the field. Examples of such special purpose circuitry 1716 include memory (e.g., DRAM) controller circuitry, PCIe controller circuitry, clock circuitry, transceiver circuitry, memory, and multiplier-accumulator circuitry. Other types of special purpose circuitry may be present. In some examples, the FPGA circuitry 1700 may also include example general purpose programmable circuitry 1718 such as an example CPU 1720 and/or an example DSP 1722. Other general purpose programmable circuitry 1718 may additionally or alternatively be present such as a GPU, an XPU, etc., that can be programmed to perform other operations.

Although FIGS. 16 and 17 illustrate two example implementations of the processor circuitry 1512 of FIG. 15, many other approaches are contemplated. For example, as mentioned above, modern FPGA circuitry may include an on-board CPU, such as one or more of the example CPU 1720 of FIG. 17. Therefore, the processor circuitry 1512 of FIG. 15 may additionally be implemented by combining the example microprocessor 1600 of FIG. 16 and the example FPGA circuitry 1700 of FIG. 17. In some such hybrid examples, a first portion of the machine readable instructions represented by the flowchart of FIGS. 8-14 may be executed by one or more of the cores 1602 of FIG. 16 and a second portion of the machine readable instructions represented by the flowchart of FIGS. 8-14 may be executed by the FPGA circuitry 1700 of FIG. 17.

In some examples, the processor circuitry 1512 of FIG. 15 may be in one or more packages. For example, the processor circuitry 1600 of FIG. 16 and/or the FPGA circuitry 1700 of FIG. 17 may be in one or more packages. In some examples, an XPU may be implemented by the processor circuitry 1512 of FIG. 15, which may be in one or more packages. For example, the XPU may include a CPU in one package, a DSP in another package, a GPU in yet another package, and an FPGA in still yet another package.

Figure 18:
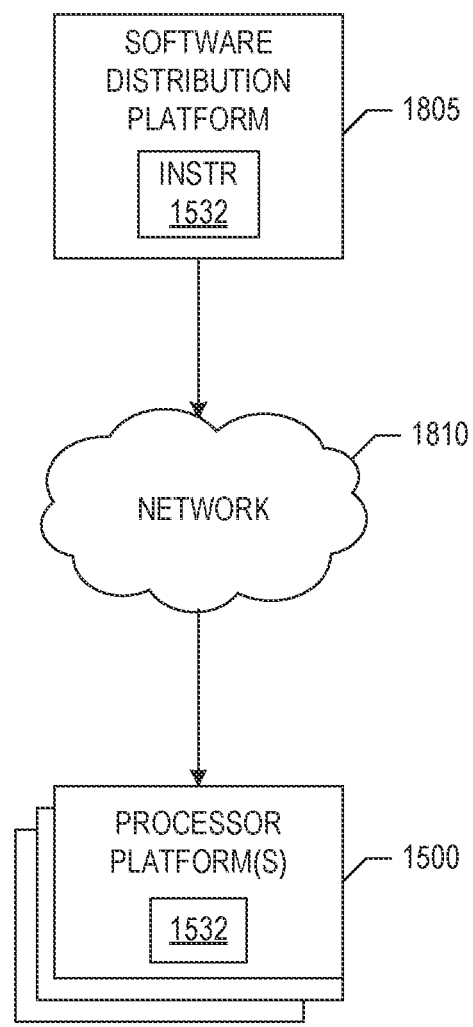
FIG. 18 is a block diagram of an example software distribution platform (e.g., one or more servers) to distribute software (e.g., software corresponding to the example machine readable instructions of FIG. 11) to client devices associated with end users and/or consumers (e.g., for license, sale, and/or use), retailers (e.g., for sale, re-sale, license, and/or sub-license), and/or original equipment manufacturers (OEMs) (e.g., for inclusion in products to be distributed to, for example, retailers and/or to other end users such as direct buy customers).

A block diagram illustrating an example software distribution platform 1805 to distribute software such as the example machine readable instructions 1532 of FIG. 15 to hardware devices owned and/or operated by third parties is illustrated in FIG. 18. The example software distribution platform 1805 may be implemented by any computer server, data facility, cloud service, etc., capable of storing and transmitting software to other computing devices. The third parties may be customers of the entity owning and/or operating the software distribution platform 1805. For example, the entity that owns and/or operates the software distribution platform 1805 may be a developer, a seller, and/or a licensor of software such as the example machine readable instructions 1532 of FIG. 15. The third parties may be consumers, users, retailers, OEMs, etc., who purchase and/or license the software for use and/or re-sale and/or sub-licensing. In the illustrated example, the software distribution platform 1805 includes one or more servers and one or more storage devices. The storage devices store the machine readable instructions 1532, which may correspond to the example machine readable instructions of FIGS. 8-14, as described above. The one or more servers of the example software distribution platform 1805 are in communication with a network 1810, which may correspond to any one or more of the Internet and/or any of the example networks described above. In some examples, the one or more servers are responsive to requests to transmit the software to a requesting party as part of a commercial transaction. Payment for the delivery, sale, and/or license of the software may be handled by the one or more servers of the software distribution platform and/or by a third party payment entity. The servers enable purchasers and/or licensors to download the machine readable instructions 1532 from the software distribution platform 1805. For example, the software, which may correspond to the example machine readable instructions FIGS. 8-14, may be downloaded to the example processor platform 1500, which is to execute the machine readable instructions 1532 to implement the testing computing device 518. In some example, one or more servers of the software distribution platform 1805 periodically offer, transmit, and/or force updates to the software (e.g., the example machine readable instructions 1532 of FIG. 15) to ensure improvements, patches, updates, etc., are distributed and applied to the software at the end user devices.

In further examples, any of the compute nodes or devices discussed with reference to the present Edge computing systems and environment may be fulfilled based on the components depicted in FIGS. 19 and 20. Respective Edge compute nodes may be embodied as a type of device, appliance, computer, or other "thing" capable of communicating with other Edge, networking, or endpoint components. For example, an Edge compute device may be embodied as a personal computer, server, smartphone, a mobile compute device, a smart appliance, an in-vehicle compute system (e.g., a navigation system), a self-contained device having an outer case, shell, etc., or other device or system capable of performing the described functions.

Figure 19:
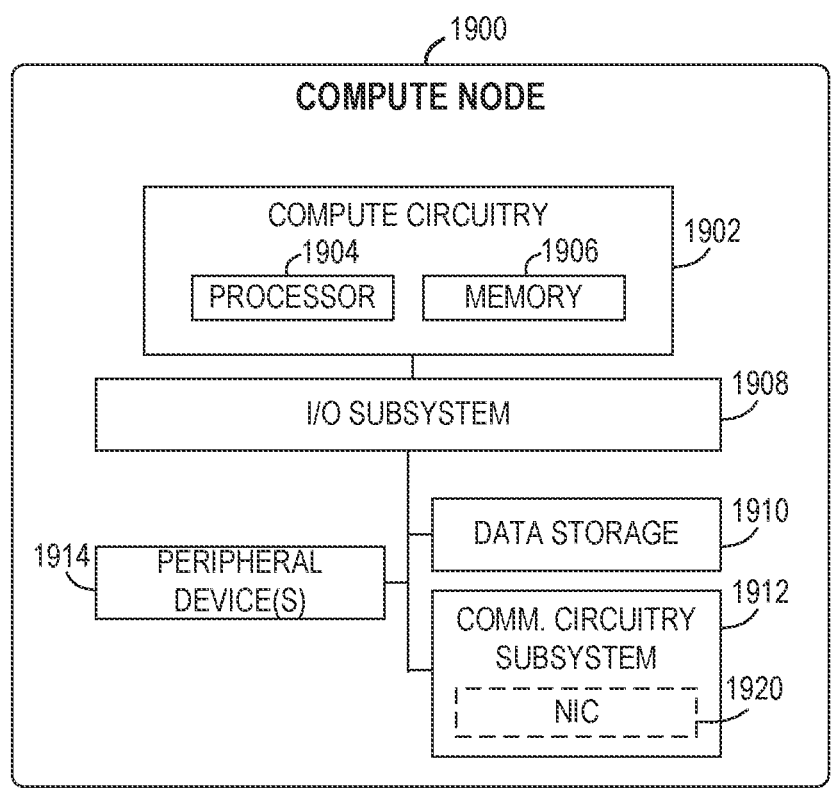
FIG. 19 provides an overview of example components for compute deployed at a compute node in an Edge computing system.

In the simplified example depicted in FIG. 19, an Edge compute node 1900 includes a compute engine (also referred to herein as "compute circuitry") 1902, an input/output (I/O) subsystem (also referred to herein as "I/O circuitry") 1908, data storage (also referred to herein as "data storage circuitry") 1910, a communication circuitry subsystem 1912, and, optionally, one or more peripheral devices (also referred to herein as "peripheral device circuitry") 1914. In other examples, respective compute devices may include other or additional components, such as those typically found in a computer (e.g., a display, peripheral devices, etc.). Additionally, in some examples, one or more of the illustrative components may be incorporated in, or otherwise form a portion of, another component.

The compute node 1900 may be embodied as any type of engine, device, or collection of devices capable of performing various compute functions. In some examples, the compute node 1900 may be embodied as a single device such as an integrated circuit, an embedded system, a field-programmable gate array (FPGA), a system-on-a-chip (SOC), or other integrated system or device. In the illustrative example, the compute node 1900 includes or is embodied as a processor (also referred to herein as "processor circuitry") 1904 and a memory (also referred to herein as "memory circuitry") 1906. The processor 1904 may be embodied as any type of processor(s) capable of performing the functions described herein (e.g., executing an application). For example, the processor 1904 may be embodied as a multi-core processor(s), a microcontroller, a processing unit, a specialized or special purpose processing unit, or other processor or processing/controlling circuit.

In some examples, the processor 1904 may be embodied as, include, or be coupled to an FPGA, an application specific integrated circuit (ASIC), reconfigurable hardware or hardware circuitry, or other specialized hardware to facilitate performance of the functions described herein. Also in some examples, the processor 1904 may be embodied as a specialized x-processing unit (xPU) also known as a data processing unit (DPU), infrastructure processing unit (IPU), or network processing unit (NPU). Such an xPU may be embodied as a standalone circuit or circuit package, integrated within an SOC, or integrated with networking circuitry (e.g., in a SmartNIC, or enhanced SmartNIC), acceleration circuitry, storage devices, storage disks, or AI hardware (e.g., GPUs, programmed FPGAs, or ASICs tailored to implement an AI model such as a neural network). Such an xPU may be designed to receive, retrieve, and/or otherwise obtain programming to process one or more data streams and perform specific tasks and actions for the data streams (such as hosting microservices, performing service management or orchestration, organizing or managing server or data center hardware, managing service meshes, or collecting and distributing telemetry), outside of the CPU or general purpose processing hardware. However, it will be understood that an xPU, an SOC, a CPU, and other variations of the processor 1904 may work in coordination with each other to execute many types of operations and instructions within and on behalf of the compute node 1900.

The memory 1906 may be embodied as any type of volatile (e.g., dynamic random access memory (DRAM), etc.) or non-volatile memory or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM).

In an example, the memory device (e.g., memory circuitry) is any number of block addressable memory devices, such as those based on NAND or NOR technologies (for example, Single-Level Cell ("SLC"), Multi-Level Cell ("MLC"), Quad-Level Cell ("QLC"), Tri-Level Cell ("TLC"), or some other NAND). In some examples, the memory device(s) includes a byte-addressable write-in-place three dimensional crosspoint memory device, or other byte addressable write-in-place non-volatile memory (NVM) devices, such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric transistor random access memory (FeTRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, a combination of any of the above, or other suitable memory. A memory device may also include a three-dimensional crosspoint memory device (e.g., Intel® 3D XPoint™ memory), or other byte addressable write-in-place nonvolatile memory devices. The memory device may refer to the die itself and/or to a packaged memory product. In some examples, 3D crosspoint memory (e.g., Intel® 3D XPoint™ memory) may include a transistor-less stackable cross point architecture in which memory cells sit at the intersection of word lines and bit lines and are individually addressable and in which bit storage is based on a change in bulk resistance. In some examples, all or a portion of the memory 1906 may be integrated into the processor 1904. The memory 1906 may store various software and data used during operation such as one or more applications, data operated on by the application(s), libraries, and drivers.

In some examples, resistor-based and/or transistor-less memory architectures include nanometer scale phase-change memory (PCM) devices in which a volume of phase-change material resides between at least two electrodes. Portions of the example phase-change material exhibit varying degrees of crystalline phases and amorphous phases, in which varying degrees of resistance between the at least two electrodes can be measured. In some examples, the phase-change material is a chalcogenide-based glass material. Such resistive memory devices are sometimes referred to as memristive devices that remember the history of the current that previously flowed through them. Stored data is retrieved from example PCM devices by measuring the electrical resistance, in which the crystalline phases exhibit a relatively lower resistance value(s) (e.g., logical "0") when compared to the amorphous phases having a relatively higher resistance value(s) (e.g., logical "1").

Example PCM devices store data for long periods of time (e.g., approximately 10 years at room temperature). Write operations to example PCM devices (e.g., set to logical "0", set to logical "1", set to an intermediary resistance value) are accomplished by applying one or more current pulses to the at least two electrodes, in which the pulses have a particular current magnitude and duration. For instance, a long low current pulse (SET) applied to the at least two electrodes causes the example PCM device to reside in a low-resistance crystalline state, while a comparatively short high current pulse (RESET) applied to the at least two electrodes causes the example PCM device to reside in a high-resistance amorphous state.

In some examples, implementation of PCM devices facilitates non-von Neumann computing architectures that enable in-memory computing capabilities. Generally speaking, traditional computing architectures include a central processing unit (CPU) communicatively connected to one or more memory devices via a bus. As such, a finite amount of energy and time is consumed to transfer data between the CPU and memory, which is a known bottleneck of von Neumann computing architectures. However, PCM devices minimize and, in some cases, eliminate data transfers between the CPU and memory by performing some computing operations in-memory. Stated differently, PCM devices both store information and execute computational tasks. Such non-von Neumann computing architectures may implement vectors having a relatively high dimensionality to facilitate hyperdimensional computing, such as vectors having 10,000 bits. Relatively large bit width vectors enable computing paradigms modeled after the human brain, which also processes information analogous to wide bit vectors.

The compute circuitry 1902 is communicatively coupled to other components of the compute node 1900 via the I/O subsystem 1908, which may be embodied as circuitry and/or components to facilitate input/output operations with the compute circuitry 1902 (e.g., with the processor 1904 and/or the main memory 1906) and other components of the compute circuitry 1902. For example, the I/O subsystem 1908 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some examples, the I/O subsystem 1908 may form a portion of a system-on-a-chip (SoC) and be incorporated, along with one or more of the processor 1904, the memory 1906, and other components of the compute circuitry 1902, into the compute circuitry 1902.

The one or more illustrative data storage devices/disks 1910 may be embodied as one or more of any type(s) of physical device(s) configured for short-term or long-term storage of data such as, for example, memory devices, memory, circuitry, memory cards, flash memory, hard disk drives (HDDs), solid-state drives (SSDs), and/or other data storage devices/disks. Individual data storage devices/disks 1910 may include a system partition that stores data and firmware code for the data storage device/disk 1910. Individual data storage devices/disks 1910 may also include one or more operating system partitions that store data files and executables for operating systems depending on, for example, the type of compute node 1900.

The communication circuitry 1912 may be embodied as any communication circuit, device, or collection thereof, capable of enabling communications over a network between the compute circuitry 1902 and another compute device (e.g., an Edge gateway of an implementing Edge computing system). The communication circuitry 1912 may be configured to use any one or more communication technology (e.g., wired or wireless communications) and associated protocols (e.g., a cellular networking protocol such a 3GPP 4G or 5G standard, a wireless local area network protocol such as IEEE 802.11/Wi-Fi®, a wireless wide area network protocol, Ethernet, Bluetooth®, Bluetooth Low Energy, a IoT protocol such as IEEE 802.15.4 or ZigBee®, low-power wide-area network (LPWAN) or low-power wide-area (LPWA) protocols, etc.) to effect such communication.

The illustrative communication circuitry 1912 includes a network interface controller (NIC) 1920, which may also be referred to as a host fabric interface (HFI). The NIC 1920 may be embodied as one or more add-in-boards, daughter cards, network interface cards, controller chips, chipsets, or other devices that may be used by the compute node 1900 to connect with another compute device (e.g., an Edge gateway node). In some examples, the NIC 1920 may be embodied as part of a system-on-a-chip (SoC) that includes one or more processors, or included on a multichip package that also contains one or more processors. In some examples, the NIC 1920 may include a local processor (not shown) and/or a local memory (not shown) that are both local to the NIC 1920. In such examples, the local processor of the NIC 1920 may be capable of performing one or more of the functions of the compute circuitry 1902 described herein. Additionally, or alternatively, in such examples, the local memory of the NIC 1920 may be integrated into one or more components of the client compute node at the board level, socket level, chip level, and/or other levels.

Additionally, in some examples, a respective compute node 1900 may include one or more peripheral devices 1914. Such peripheral devices 1914 may include any type of peripheral device found in a compute device or server such as audio input devices, a display, other input/output devices, interface devices, and/or other peripheral devices, depending on the particular type of the compute node 1900. In further examples, the compute node 1900 may be embodied by a respective Edge compute node (whether a client, gateway, or aggregation node) in an Edge computing system or like forms of appliances, computers, subsystems, circuitry, or other components.

Figure 20:
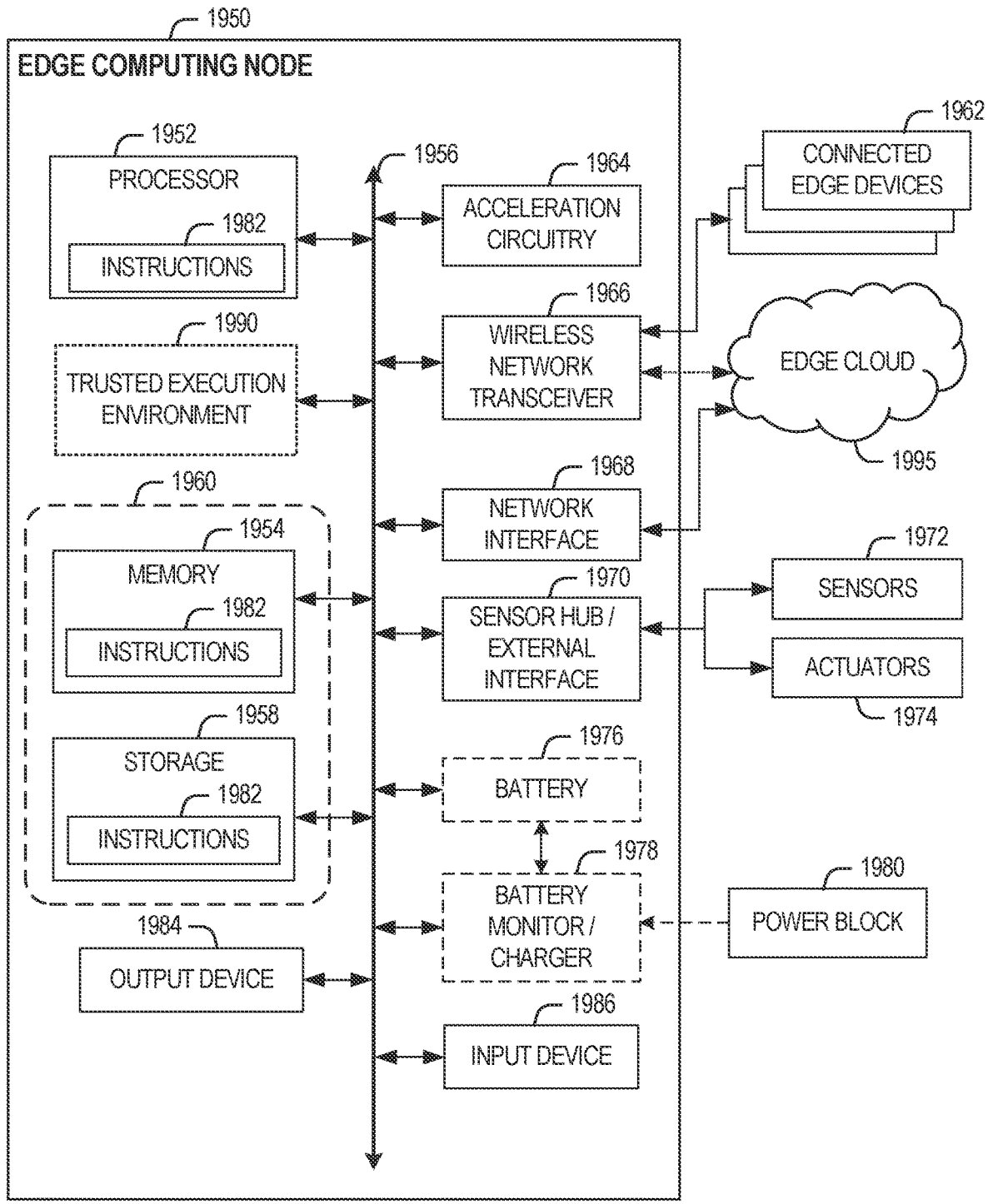
FIG. 20 provides a further overview of example components within a computing device in an Edge computing system.

In a more detailed example, FIG. 20 illustrates a block diagram of an example of components that may be present in an Edge computing node 1950 for implementing the techniques (e.g., operations, processes, methods, and methodologies) described herein. This Edge computing node 1950 provides a closer view of the respective components of node 1900 when implemented as or as part of a computing device (e.g., as a mobile device, a base station, server, gateway, etc.). The Edge computing node 1950 may include any combination of the hardware or logical components referenced herein, and it may include or couple with any device usable with an Edge communication network or a combination of such networks. The components may be implemented as integrated circuits (ICs), portions thereof, discrete electronic devices, or other modules, instruction sets, programmable logic or algorithms, hardware, hardware accelerators, software, firmware, or a combination thereof adapted in the Edge computing node 1950, or as components otherwise incorporated within a chassis of a larger system.

The Edge computing device 1950 may include processing circuitry in the form of a processor 1952, which may be a microprocessor, a multi-core processor, a multithreaded processor, an ultra-low voltage processor, an embedded processor, an xPU/DPU/IPU/NPU, special purpose processing unit, specialized processing unit, or other known processing elements. The processor 1952 may be a part of a system on a chip (SoC) in which the processor 1952 and other components are formed into a single integrated circuit, or a single package, such as the Edison™ or Galileo™ SoC boards from Intel Corporation, Santa Clara, California As an example, the processor 1952 may include an Intel® Architecture Core™ based CPU processor, such as a Quark™, an Atom™, an i3, an i5, an i7, an i9, or an MCU-class processor, or another such processor available from Intel®. However, any number other processors may be used, such as available from Advanced Micro Devices, Inc. (AMD®) of Sunnyvale, California, a MIPS®-based design from MIPS Technologies, Inc. of Sunnyvale, California, an ARM®-based design licensed from ARM Holdings, Ltd. or a customer thereof, or their licensees or adopters. The processors may include units such as an A5-13 processor from Apple® Inc., a Snapdragon™ processor from Qualcomm® Technologies, Inc., or an OMAP™ processor from Texas Instruments, Inc. The processor 1952 and accompanying circuitry may be provided in a single socket form factor, multiple socket form factor, or a variety of other formats, including in limited hardware configurations or configurations that include fewer than all elements shown in FIG. 20.

The processor 1952 may communicate with a system memory 1954 over an interconnect 1956 (e.g., a bus). Any number of memory devices may be used to provide for a given amount of system memory. As examples, the memory

1954 may be random access memory (RAM) in accordance with a Joint Electron Devices Engineering Council (JEDEC) design such as the DDR or mobile DDR standards (e.g., LPDDR, LPDDR2, LPDDR3, or LPDDR4). In particular examples, a memory component may comply with a DRAM standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces. In various implementations, the individual memory devices may be of any number of different package types such as single die package (SDP), dual die package (DDP) or quad die package (Q17P). These devices, in some examples, may be directly soldered onto a motherboard to provide a lower profile solution, while in other examples the devices are configured as one or more memory modules that in turn couple to the motherboard by a given connector. Any number of other memory implementations may be used, such as other types of memory modules, e.g., dual inline memory modules (DIMMs) of different varieties including but not limited to microDIMMs or MiniDIMMs.

To provide for persistent storage of information such as data, applications, operating systems and so forth, a storage 1958 may also couple to the processor 1952 via the interconnect 1956. In an example, the storage 1958 may be implemented via a solid-state disk drive (SSDD). Other devices that may be used for the storage 1958 include flash memory cards, such as Secure Digital (SD) cards, microSD cards, eXtreme Digital (XD) picture cards, and the like, and Universal Serial Bus (USB) flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

In low power implementations, the storage 1958 may be on-die memory or registers associated with the processor 1952. However, in some examples, the storage 1958 may be implemented using a micro hard disk drive (HDD). Further, any number of new technologies may be used for the storage 1958 in addition to, or instead of, the technologies described, such resistance change memories, phase change memories, holographic memories, or chemical memories, among others.

The components may communicate over the interconnect 1956. The interconnect 1956 may include any number of technologies, including industry standard architecture (ISA), extended ISA (EISA), peripheral component interconnect (PCI), peripheral component interconnect extended (PCIx), PCI express (PCIe), or any number of other technologies. The interconnect 1956 may be a proprietary bus, for example, used in an SoC based system. Other bus systems may be included, such as an Inter-Integrated Circuit (I2C) interface, a Serial Peripheral Interface (SPI) interface, point to point interfaces, and a power bus, among others.

The interconnect 1956 may couple the processor 1952 to a transceiver 1966, for communications with the connected Edge devices 1962. The transceiver 1966 may use any number of frequencies and protocols, such as 2.4 Gigahertz (GHz) transmissions under the IEEE 802.15.4 standard, using the Bluetooth® low energy (BLE) standard, as defined by the Bluetooth® Special Interest Group, or the ZigBee® standard, among others. Any number of radios, configured for a particular wireless communication protocol, may be used for the connections to the connected Edge devices 1962. For example, a wireless local area network (WLAN) unit may be used to implement Wi-Fi® communications in accordance with the Institute of Electrical and Electronics Engineers (IEEE) 802.11 standard. In addition, wireless wide area communications, e.g., according to a cellular or other wireless wide area protocol, may occur via a wireless wide area network (WWAN) unit.

The wireless network transceiver 1966 (or multiple transceivers) may communicate using multiple standards or radios for communications at a different range. For example, the Edge computing node 1950 may communicate with close devices, e.g., within about 10 meters, using a local transceiver based on Bluetooth Low Energy (BLE), or another low power radio, to save power. More distant connected Edge devices 1962, e.g., within about 50 meters, may be reached over ZigBee® or other intermediate power radios. Both communications techniques may take place over a single radio at different power levels or may take place over separate transceivers, for example, a local transceiver using BLE and a separate mesh transceiver using ZigBee®.

A wireless network transceiver 1966 (e.g., a radio transceiver) may be included to communicate with devices or services in a cloud (e.g., an Edge cloud 1995) via local or wide area network protocols. The wireless network transceiver 1966 may be a low-power wide-area (LPWA) transceiver that follows the IEEE 802.15.4, or IEEE 802.15.4g standards, among others. The Edge computing node 1950 may communicate over a wide area using LoRaWAN™ (Long Range Wide Area Network) developed by Semtech and the LoRa Alliance. The techniques described herein are not limited to these technologies but may be used with any number of other cloud transceivers that implement long range, low bandwidth communications, such as Sigfox, and other technologies. Further, other communications techniques, such as time-slotted channel hopping, described in the IEEE 802.15.4e specification may be used.

Any number of other radio communications and protocols may be used in addition to the systems mentioned for the wireless network transceiver 1966, as described herein. For example, the transceiver 1966 may include a cellular transceiver that uses spread spectrum (SPA/SAS) communications for implementing high-speed communications. Further, any number of other protocols may be used, such as Wi-Fi® networks for medium speed communications and provision of network communications. The transceiver 1966 may include radios that are compatible with any number of 3GPP (Third Generation Partnership Project) specifications, such as Long Term Evolution (LTE) and 5th Generation (5G) communication systems, discussed in further detail at the end of the present disclosure. A network interface controller (NIC) 1968 may be included to provide a wired communication to nodes of the Edge cloud 1995 or to other devices, such as the connected Edge devices 1962 (e.g., operating in a mesh). The wired communication may provide an Ethernet connection or may be based on other types of networks, such as Controller Area Network (CAN), Local Interconnect Network (LIN), DeviceNet, ControlNet, Data Highway+, PROFIBUS, or PROFINET, among many others. An additional NIC 1968 may be included to enable connecting to a second network, for example, a first NIC 1968 providing communications to the cloud over Ethernet, and a second NIC 1968 providing communications to other devices over another type of network.

Given the variety of types of applicable communications from the device to another component or network, applicable communications circuitry used by the device may include or be embodied by any one or more of components 1964, 1966, 1968, or 1970. Accordingly, in various examples, applicable means for communicating (e.g., receiving, transmitting, etc.) may be embodied by such communications circuitry.

The Edge computing node 1950 may include or be coupled to acceleration circuitry 1964, which may be embodied by one or more artificial intelligence (AI) accelerators, a neural compute stick, neuromorphic hardware, an FPGA, an arrangement of GPUs, an arrangement of xPUs/DPUs/IPU/NPUs, one or more SoCs, one or more CPUs, one or more digital signal processors, dedicated ASICs, or other forms of specialized processors or circuitry designed to accomplish one or more specialized tasks. These tasks may include AI processing (including machine learning, training, inferencing, and classification operations), visual data processing, network data processing, object detection, rule analysis, or the like. These tasks also may include the specific Edge computing tasks for service management and service operations discussed elsewhere in this document.

The interconnect 1956 may couple the processor 1952 to a sensor hub or external interface 1970 that is used to connect additional devices or subsystems. The devices may include sensors 1972, such as accelerometers, level sensors, flow sensors, optical light sensors, camera sensors, temperature sensors, global navigation system (e.g., GPS) sensors, pressure sensors, barometric pressure sensors, and the like. The hub or interface 1970 further may be used to connect the Edge computing node 1950 to actuators 1974, such as power switches, valve actuators, an audible sound generator, a visual warning device, and the like.

In some optional examples, various input/output (I/O) devices may be present within or connected to, the Edge computing node 1950. For example, a display or other output device 1984 may be included to show information, such as sensor readings or actuator position. An input device 1986, such as a touch screen or keypad may be included to accept input. An output device 1984 may include any number of forms of audio or visual display, including simple visual outputs such as binary status indicators (e.g., light-emitting diodes (LEDs)) and multi-character visual outputs, or more complex outputs such as display screens (e.g., liquid crystal display (LCD) screens), with the output of characters, graphics, multimedia objects, and the like being generated or produced from the operation of the Edge computing node 1950. A display or console hardware, in the context of the present system, may be used to provide output and receive input of an Edge computing system; to manage components or services of an Edge computing system; identify a state of an Edge computing component or service; or to conduct any other number of management or administration functions or service use cases.

A battery 1976 may power the Edge computing node 1950, although, in examples in which the Edge computing node 1950 is mounted in a fixed location, it may have a power supply coupled to an electrical grid, or the battery may be used as a backup or for temporary capabilities. The battery 1976 may be a lithium ion battery, or a metal-air battery, such as a zinc-air battery, an aluminum-air battery, a lithium-air battery, and the like.

A battery monitor/charger 1978 may be included in the Edge computing node 1950 to track the state of charge (SoCh) of the battery 1976, if included. The battery monitor/charger 1978 may be used to monitor other parameters of the battery 1976 to provide failure predictions, such as the state of health (SoH) and the state of function (SoF) of the battery 1976. The battery monitor/charger 1978 may include a battery monitoring integrated circuit, such as an LTC4020 or an LT5990 from Linear Technologies, an ADT7488A from ON Semiconductor of Phoenix, Arizona, or an IC from the UCD90xxx family from Texas Instruments of Dallas, TX The battery monitor/charger 1978 may communicate the information on the battery 1976 to the processor 1952 over the interconnect 1956. The battery monitor/charger 1978 may also include an analog-to-digital (ADC) converter that enables the processor 1952 to directly monitor the voltage of the battery 1976 or the current flow from the battery 1976. The battery parameters may be used to determine actions that the Edge computing node 1950 may perform, such as transmission frequency, mesh network operation, sensing frequency, and the like.

A power block 1980, or other power supply coupled to a grid, may be coupled with the battery monitor/charger 1978 to charge the battery 1976. In some examples, the power block 1980 may be replaced with a wireless power receiver to obtain the power wirelessly, for example, through a loop antenna in the Edge computing node 1950. A wireless battery charging circuit, such as an LTC4020 chip from Linear Technologies of Milpitas, California, among others, may be included in the battery monitor/charger 1978. The specific charging circuits may be selected based on the size of the battery 1976, and thus, the current required. The charging may be performed using the Airfuel standard promulgated by the Airfuel Alliance, the Qi wireless charging standard promulgated by the Wireless Power Consortium, or the Rezence charging standard, promulgated by the Alliance for Wireless Power, among others.

The storage 1958 may include instructions 1982 in the form of software, firmware, or hardware commands to implement the techniques described herein. Although such instructions 1982 are shown as code blocks included in the memory 1954 and the storage 1958, it may be understood that any of the code blocks may be replaced with hardwired circuits, for example, built into an application specific integrated circuit (ASIC).

In an example, the instructions 1982 provided via the memory 1954, the storage 1958, or the processor 1952 may be embodied as a non-transitory, machine-readable medium 1960 including code to direct the processor 1952 to perform electronic operations in the Edge computing node 1950. The processor 1952 may access the non-transitory, machine-readable medium 1960 over the interconnect 1956. For instance, the non-transitory, machine-readable medium 1960 may be embodied by devices described for the storage 1958 or may include specific storage units such as storage devices and/or storage disks that include optical disks (e.g., digital versatile disk (DVD), compact disk (CD), CD-ROM, Blu-ray disk), flash drives, floppy disks, hard drives (e.g., SSDs), or any number of other hardware devices in which information is stored for any duration (e.g., for extended time periods, permanently, for brief instances, for temporarily buffering, and/or caching). The non-transitory, machine-readable medium 1960 may include instructions to direct the processor 1952 to perform a specific sequence or flow of actions, for example, as described with respect to the flowchart(s) and block diagram(s) of operations and functionality depicted above. As used herein, the terms "machine-readable medium" and "computer-readable medium" are interchangeable. As used herein, the term "non-transitory computer-readable medium" is expressly defined to include any type of computer readable storage device and/or storage disk and to exclude propagating signals and to exclude transmission media.

Also in a specific example, the instructions 1982 on the processor 1952 (separately, or in combination with the instructions 1982 of the machine readable medium 1960) may configure execution or operation of a trusted execution environment (TEE) 1990. In an example, the TEE 1990 operates as a protected area accessible to the processor 1952 for secure execution of instructions and secure access to data. Various implementations of the TEE 1990, and an accompanying secure area in the processor 1952 or the memory 1954 may be provided, for instance, through use of Intel® Software Guard Extensions (SGX) or ARM® TrustZone® hardware security extensions, Intel® Management Engine (ME), or Intel® Converged Security Manageability Engine (CSME). Other aspects of security hardening, hardware roots-of-trust, and trusted or protected operations may be implemented in the device 1950 through the TEE 1990 and the processor 1952.

While the illustrated examples of FIG. 19 and FIG. 20 include example components for a compute node and a computing device, respectively, examples disclosed herein are not limited thereto. As used herein, a "computer" may include some or all of the example components of FIGS. 19 and/or 20 in different types of computing environments. Example computing environments include Edge computing devices (e.g., Edge computers) in a distributed networking arrangement such that particular ones of participating Edge computing devices are heterogenous or homogeneous devices. As used herein, a "computer" may include a personal computer, a server, user equipment, an accelerator, etc., including any combinations thereof. In some examples, distributed networking and/or distributed computing includes any number of such Edge computing devices as illustrated in FIGS. 19 and/or 20, each of which may include different sub-components, different memory capacities, I/O capabilities, etc. For example, because some implementations of distributed networking and/or distributed computing are associated with particular desired functionality, examples disclosed herein include different combinations of components illustrated in FIGS. 19 and/or 20 to satisfy functional objectives of distributed computing tasks. In some examples, the term "compute node" or "computer" only includes the example processor 1904, memory 1906 and I/O subsystem 1908 of FIG. 19. In some examples, one or more objective functions of a distributed computing task(s) rely on one or more alternate devices/structure located in different parts of an Edge networking environment, such as devices to accommodate data storage (e.g., the example data storage 1910), input/output capabilities (e.g., the example peripheral device(s) 1914), and/or network communication capabilities (e.g., the example NIC 1920).

In some examples, computers operating in a distributed computing and/or distributed networking environment (e.g., an Edge network) are structured to accommodate particular objective functionality in a manner that reduces computational waste. For instance, because a computer includes a subset of the components disclosed in FIGS. 19 and 20, such computers satisfy execution of distributed computing objective functions without including computing structure that would otherwise be unused and/or underutilized. As such, the term "computer" as used herein includes any combination of structure of FIGS. 19 and/or 20 that is capable of satisfying and/or otherwise executing objective functions of distributed computing tasks. In some examples, computers are structured in a manner commensurate to corresponding distributed computing objective functions in a manner that downscales or upscales in connection with dynamic demand. In some examples, different computers are invoked and/or otherwise instantiated in view of their ability to process one or more tasks of the distributed computing request(s), such that any computer capable of satisfying the tasks proceed with such computing activity.

In the illustrated examples of FIGS. 19 and 20, computing devices include operating systems. As used herein, an "operating system" is software to control example computing devices, such as the example Edge compute node 1900 of FIG. 19 and/or the example Edge compute node 1950 of FIG. 20. Example operating systems include, but are not limited to consumer-based operating systems (e.g., Microsoft® Windows® 10, Google® Android® OS, Apple® Mac® OS, etc.). Example operating systems also include, but are not limited to industry-focused operating systems, such as real-time operating systems, hypervisors, etc. An example operating system on a first Edge compute node may be the same or different than an example operating system on a second Edge compute node. In some examples, the operating system invokes alternate software to facilitate one or more functions and/or operations that are not native to the operating system, such as particular communication protocols and/or interpreters. In some examples, the operating system instantiates various functionalities that are not native to the operating system. In some examples, operating systems include varying degrees of complexity and/or capabilities. For instance, a first operating system corresponding to a first Edge compute node includes a real-time operating system having particular performance expectations of responsivity to dynamic input conditions, and a second operating system corresponding to a second Edge compute node includes graphical user interface capabilities to facilitate end-user I/O.

From the foregoing, it will be appreciated that example systems, methods, apparatus, and articles of manufacture have been disclosed that facilitate improved testing of computing system components such as programmable network devices.

Example methods, apparatus, systems, and articles of manufacture for networked device testing are disclosed herein. Further examples and combinations thereof include the following:

Example 1 includes a non-transitory computer readable medium comprising instructions that, when executed by logic circuitry, cause the logic circuitry to at least determine an input to be applied to a programmable network device, mutate the input to determine an input variant, transmit the input variant to the programmable network device, and in response to determining that the input variant causes the programmable network device to enter an expected state, add the input variant to a test set.

Example 2 includes the non-transitory computer readable medium as defined in example 1, wherein the instructions, when executed, cause the logic circuitry to determine a testing coverage for the programmable network device.

Example 3 includes the non-transitory computer readable medium as defined in example 1, wherein the instructions, when executed, cause the logic circuitry to determine a further input variant based on the testing coverage.

Example 4 includes the non-transitory computer readable medium as defined in example 1, wherein the instructions, when executed, cause the logic circuitry to store the input variant in a test coverage matrix.

Example 5 includes the non-transitory computer readable medium as defined in example 1, wherein the instructions, when executed, cause the logic circuitry to add the input variant to the test set in response to determining that the input variant causes the programmable device to detect an error.

Example 6 includes the non-transitory computer readable medium as defined in example 1, wherein the instructions, when executed, cause the logic circuitry to create a virtual partition associated with the programmable network device.

Example 7 includes the non-transitory computer readable medium as defined in example 6, wherein the instructions, when executed, cause the logic circuitry to shift responsibilities of a partition of the programmable network device to the virtual partition.

Example 8 includes the non-transitory computer readable medium as defined in example 7, wherein the instructions, when executed, cause the logic circuitry to shift responsibilities of the virtual partition to the partition of the programmable network device after the input variant is processed by the programmable network device.

Example 9 includes an apparatus for networked device testing, the apparatus comprising interface circuitry, processor circuitry including one or more of at least one of a central processing unit, a graphic processing unit or a digital signal processor, the at least one of the central processing unit, the graphic processing unit or the digital signal processor having control circuitry to control data movement within the processor circuitry, arithmetic and logic circuitry to perform one or more first operations corresponding to instructions, and one or more registers to store a result of the one or more first operations, the instructions in the apparatus, a Field Programmable Gate Array (FPGA), the FPGA including logic gate circuitry, a plurality of configurable interconnections, and storage circuitry, the logic gate circuitry and interconnections to perform one or more second operations, the storage circuitry to store a result of the one or more second operations, or Application Specific Integrated Circuitry (ASIC) including logic gate circuitry to perform one or more third operations, the processor circuitry to perform at least one of the first operations, the second operations or the third operations to instantiate input selector circuitry to select a test parameter to be applied to a programmable network device, mutations generator circuitry to mutate the test parameter to determine an input variant, the input selector circuitry to transmit the input variant to the programmable network device, and results analyzer circuitry to, in response to determining that the input variant causes the programmable network device to enter an expected state, add the input variant to a test set.

Example 10 includes the apparatus as defined in example 9, wherein the processor circuitry is further to instantiate policy handler circuitry to determine a testing coverage for the programmable network device.

Example 11 includes the apparatus as defined in example 9, wherein mutations generator circuitry is to determine a further input variant based on the testing coverage.

Example 12 includes the apparatus as defined in example 9, wherein the results analyzer circuitry is to store the input variant in a test coverage matrix.

Example 13 includes the apparatus as defined in example 9, wherein the results analyzer circuitry is to add the input variant to the test set in response to determining that the input variant causes the programmable device to detect an error.

Example 14 includes the apparatus as defined in example 9, wherein the input selector circuitry is to create a virtual partition associated with the programmable network device.

Example 15 includes the apparatus as defined in example 14, wherein the results analyzer circuitry is to shift responsibilities of a partition of the programmable network device to the virtual partition.

Example 16 includes the apparatus as defined in example 15, wherein the results analyzer circuitry is to shift responsibilities of the virtual partition to the partition of the programmable network device after the input variant is processed by the programmable network device.

Example 17 includes a method for networked component testing, the method comprising determining an input to be applied to a programmable network device, fuzzing the input to determine an input variant, transmitting the input variant to the programmable network device, and in response to determining that the input variant causes the programmable network device to enter an expected state, adding the input variant to a test set.

Example 18 includes the method as defined in example 17, further comprising determining a testing coverage for the programmable network device.

Example 19 includes the method as defined in example 17, further comprising determining a further input variant based on the testing coverage.

Example 20 includes the method as defined in example 17, further comprising storing the input variant in a test coverage matrix.

Example 21 includes the method as defined in example 17, further comprising adding the input variant to the test set in response to determining that the input variant causes the programmable device to detect an error.

Example 22 includes the method as defined in example 17, further comprising creating a virtual partition associated with the programmable network device.

Example 23 includes the method as defined in example 22, further comprising shifting responsibilities of a partition of the programmable network device to the virtual partition.

Example 24 includes the method as defined in example 23, further comprising shifting responsibilities of the virtual partition to the partition of the programmable network device after the input variant is processed by the programmable network device.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. A non-transitory computer readable medium comprising instructions that, when executed by logic circuitry, cause the logic circuitry to at least:

determine an input to be applied to a programmable network device;

mutate the input to determine an input variant;

transmit the input variant to the programmable network device;

add the input variant to a test set after the input variant causes the programmable network device to enter an expected state;

create a virtual partition associated with the programmable network device; and shift responsibilities of a partition of the programmable network device to the virtual partition.

2. The non-transitory computer readable medium as defined in claim 1, wherein the instructions, when executed, cause the logic circuitry to determine a testing coverage for the programmable network device.

3. The non-transitory computer readable medium as defined in claim 2, wherein the instructions, when executed, cause the logic circuitry to determine a further input variant based on the testing coverage.

4. The non-transitory computer readable medium as defined in claim 1, wherein the instructions, when executed, cause the logic circuitry to store the input variant in a test coverage matrix.

5. The non-transitory computer readable medium as defined in claim 1, wherein the instructions, when executed, cause the logic circuitry to add the input variant to the test set in response to determining that the input variant causes the programmable device to detect an error.

6. The non-transitory computer readable medium as defined in claim 1, wherein the instructions, when executed, cause the logic circuitry to shift responsibilities of the virtual partition to the partition of the programmable network device after the input variant is processed by the programmable network device.

7. An apparatus for networked device testing, the apparatus comprising:

interface circuitry;

computer readable instructions; and programmable circuitry to instantiate:

input selector circuitry to select a test parameter to be applied to a programmable network device;

mutations generator circuitry to mutate the test parameter to determine an input variant, the input selector circuitry to transmit the input variant to the programmable network device;

results analyzer circuitry to:

add the input variant to a test set after the input variant causes the programmable network device to enter an expected state;

create a virtual partition associated with the programmable network device; and shift responsibilities of a partition of the programmable network device to the virtual partition.

8. The apparatus as defined in claim 7, wherein the programmable circuitry is further to instantiate policy handler circuitry to determine a testing coverage for the programmable network device.

9. The apparatus as defined in claim 8, wherein mutations generator circuitry is to determine a further input variant based on the testing coverage.

10. The apparatus as defined in claim 7, wherein the results analyzer circuitry is to store the input variant in a test coverage matrix.

11. The apparatus as defined in claim 7, wherein the results analyzer circuitry is to add the input variant to the test set in response to determining that the input variant causes the programmable device to detect an error.

12. The apparatus as defined in claim 7, wherein the results analyzer circuitry is to shift responsibilities of the virtual partition to the partition of the programmable network device after the input variant is processed by the programmable network device.

13. A method for networked component testing, the method comprising:

determining an input to be applied to a programmable network device;

fuzzing the input to determine an input variant;

transmitting the input variant to the programmable network device;

adding the input variant to a test set after the input variant causes the programmable network device to enter an expected state;

creating a virtual partition associated with the programmable network device; and shifting responsibilities of a partition of the programmable network device to the virtual partition.

14. The method as defined in claim 13, further comprising determining a testing coverage for the programmable network device.

15. The method as defined in claim 14, further comprising determining a further input variant based on the testing coverage.

16. The method as defined in claim 13, further comprising storing the input variant in a test coverage matrix.

17. The method as defined in claim 13, further comprising adding the input variant to the test set in response to determining that the input variant causes the programmable device to detect an error.

18. The method as defined in claim 13, further comprising shifting responsibilities of the virtual partition to the partition of the programmable network device after the input variant is processed by the programmable network device.

* * * * *